US007756597B2

(12) United States Patent
Van Den Nieuwelaar et al.

(10) Patent No.: US 7,756,597 B2
(45) Date of Patent: Jul. 13, 2010

(54) METHOD OF OPERATING A LITHOGRAPHIC PROCESSING MACHINE, CONTROL SYSTEM, LITHOGRAPHIC APPARATUS, LITHOGRAPHIC PROCESSING CELL, AND COMPUTER PROGRAM

(75) Inventors: Norbertus Josephus Martinus Van Den Nieuwelaar, Tilburg (NL); Willem Herman Gertruda Anna Koenen, Roermond (NL); Johannes Onvlee, 's-Hertogenbosch (NL); Henricus Petrus Johannes Van Lierop, Weert (NL); Robert Jozef Dumont, Eindhoven (NL); Jacobus Eelkman Rooda, Eindhoven (NL); Michiel Antal Rogier Stoets, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1686 days.

(21) Appl. No.: 10/953,869

(22) Filed: Sep. 30, 2004

(65) Prior Publication Data

US 2005/0102723 A1 May 12, 2005

(30) Foreign Application Priority Data

Oct. 13, 2003 (EP) .................................. 03256456

(51) Int. Cl.
*G06F 19/00* (2006.01)
(52) U.S. Cl. ................... 700/100; 700/99; 700/121; 700/103; 250/492.1; 250/492.22
(58) Field of Classification Search .................. None
See application file for complete search history.

(56) References Cited

U.S. PATENT DOCUMENTS

| | | | | |
|---|---|---|---|---|
| 6,026,365 A | * | 2/2000 | Hayashi | 705/9 |
| 6,201,999 B1 | * | 3/2001 | Jevtic | 700/100 |
| 2002/0173868 A1 | * | 11/2002 | Mukuta et al. | 700/100 |
| 2004/0029299 A1 | * | 2/2004 | Pasadyn et al. | 438/5 |
| 2005/0058446 A1 | * | 3/2005 | Plug | 396/611 |

FOREIGN PATENT DOCUMENTS

| | | |
|---|---|---|
| JP | 08-167562 A | 6/1996 |
| JP | 08-227928 A | 9/1996 |
| JP | 11-260883 A | 9/1999 |
| JP | 2001-338865 A | 12/2001 |
| JP | 2002-151403 A | 5/2002 |
| JP | 2002-217098 A | 8/2002 |
| JP | 2002-237513 A | 8/2002 |
| JP | 2002-299198 A | 10/2002 |
| JP | 2002-341923 A | 11/2002 |
| JP | 2003-100586 A | 4/2003 |

* cited by examiner

*Primary Examiner*—Hyung S Sough
*Assistant Examiner*—Syed Roni
(74) *Attorney, Agent, or Firm*—Pillsbury Winthrop Shaw Pittman LLP

(57) ABSTRACT

Scheduling of tasks in a lithographic apparatus, track unit or lithocell is performed by maintaining a register of the state of the machine and a database of tasks performable by the machine, generating possible sequences of tasks based on pre- and post-conditions on the system state (rather than a precedence relation) and selecting a sequence from the generated sequences that meets a given beginning state of the machine and a desired end state. Embodiments of the invention also allow for automated recovery from exceptions.

20 Claims, 21 Drawing Sheets

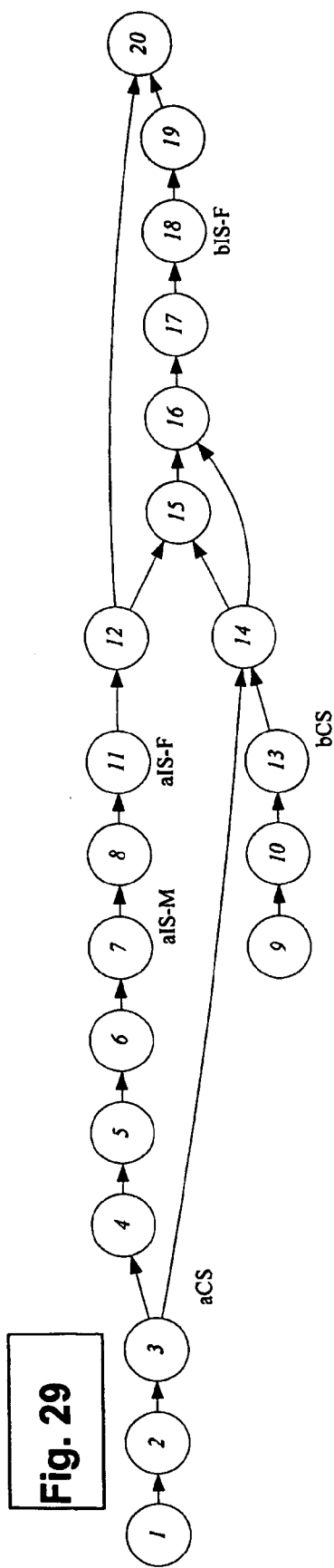

METHOD OF OPERATING A LITHOGRAPHIC PROCESSING MACHINE, CONTROL SYSTEM, LITHOGRAPHIC APPARATUS, LITHOGRAPHIC PROCESSING CELL, AND COMPUTER PROGRAM

RELATED APPLICATIONS

This application claims benefit of and priority to European Patent Application No. EP 03256456.9, filed Oct. 13, 2003, the entirety of which application is hereby incorporated by reference.

FIELD OF THE INVENTION

The present invention relates to a lithographic apparatus and lithographic processing cells, and in particular to methods of operating such.

BACKGROUND INFORMATION

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a factory, commonly referred to as a "fab" or "foundry", in which semiconductor devices are manufactured, each lithographic apparatus is commonly grouped with a "track" (e.g. comprising other lithographic processing machines such as wafer handling devices and pre- and post-processing devices) to form a lithographic processing system commonly called a lithographic processing cell or "lithocell". Both the lithographic apparatus and the track have supervisory control systems which are themselves under the control of a further supervisory control system. Wafers, which may be blank or have already been processed to include one or more process or device layers, are delivered to the lithocell in lots (also referred to as batches) for processing. A lot is, in general, a group of wafers which are to be processed by the lithocell in the same way and is accompanied by a "recipe" which specifies the processes to be carried out. The lot size may be arbitrary or determined by the size of carrier used to transport substrates around the fab. The recipe may include details of the resist coating to be applied, temperature and duration of pre- and post-exposure bakes, details of the pattern to be exposed and the exposure settings for that, development duration, etc. A large number of tasks must be performed to complete the recipe for a given batch and there are many possible ways these can be done, as in many cases both the track and lithographic apparatus are capable of performing multiple tasks at once, e.g. if the track includes multiple spin coaters or multipurpose stations or if the lithographic apparatus is a dual stage apparatus having measurement and exposure stations. Thus scheduling the tasks to be performed, and optimizing that schedule to maximize throughput, is a complex task.

In most cases, on-the-fly scheduling is limited and most sequences of tasks are hard-coded in the control software of the apparatus or the supervisory control system. Where the possibility of errors is taken into account, this is generally by hard-coded decisions of the form—if error A occurs, do task B. As the number of possible errors multiplies, so does the amount of code required to deal with them and the system is incapable of recovering from unforeseen errors. A more flexible approach to scheduling is to construct a tree based on tasks to be completed and their precedence relation. In such a tree, starting from an origin, branches represent possible tasks that may be carried and lead to nodes, from which further branches represent tasks that may then be carried out, and so on. Scheduling then becomes a matter of selecting a path through the tree. Such an approach is described in U.S. Pat. No. 6,201,999. It will be appreciated that such a tree structure rapidly becomes very large, particularly if possible errors and failures are taken into account. Thus, exception recovery is still a problem.

In a manufacturing system with multiple equivalent capabilities, the determination of what tasks are to be performed by which resource, can be divided into two parts: first determine the sequence of tasks that must be performed to complete the given work (sequencing), then determine which resources are to be used to perform which tasks. U.S. Pat. No. 5,126,932 describes a program for automatically performing the latter part—it requires as input a predetermined sequence of tasks to be performed but then decides which resource, e.g. one of several available lithographic apparatus, is to perform that sequence on a given material, e.g. a lot of wafers. The program cannot adjust the predetermined sequence and can only recover from errors in the sense that work scheduled for one apparatus might instead be performed on another if the first becomes unavailable.

SUMMARY

One embodiment of the invention is a method of operating a lithographic processing machine capable of performing a plurality of tasks and configured to have a plurality of states over time, each of the plurality of tasks being associated with a corresponding beginning state of the plurality of states, in which the machine is configured to initiate the task, and a corresponding end state of the plurality of states, in which the machine is configured to complete the task. This method comprises maintaining a state register representing a state of the machine at a corresponding time; providing a task database relating each of the plurality of tasks with its corresponding beginning and end states; based on the task database, constructing a plurality of possible sequences of tasks; selecting one among said plurality of possible sequences that starts from a given beginning state of the machine and results in a desired end state of the machine; and performing the selected possible sequence.

Another embodiment of the invention is a control system configured to operate a lithographic processing machine capable of performing a plurality of tasks and configured to have a plurality of states over time, each of the plurality of tasks being associated with a corresponding beginning state of the plurality of states, in which the machine is configured to initiate the task, and a corresponding end state of the plurality of states, in which the machine is configured to complete the task. The control system comprises a state register configured to represent a state of the machine at a corresponding time; an update mechanism configured to update said state register according to a change in the state of the machine over time; a task database configured to store information relating each of the plurality of tasks with its corresponding beginning and end states; a sequence construction mechanism configured to construct, based on the task database, a plurality of possible sequences of tasks; a search engine configured to select one among said plurality of possible sequences that starts from a given beginning state of the machine and results in a desired end state of the machine; and a controller configured to control said machine to perform the selected possible sequence.

A further embodiment of the invention is a lithographic processing machine capable of performing a plurality of tasks and configured to have a plurality of states over time, each of the plurality of tasks being associated with a corresponding beginning state of the plurality of states, in which the machine is configured to initiate the task, and a corresponding end state of the plurality of states, in which the machine is configured to complete the task, said machine comprising a control system configured to operate the machine. The control system comprises a state register configured to represent a state of the machine at a corresponding time; an update mechanism configured to update said state register according to a change in the state of the machine over time; a task database configured to store information relating each of the plurality of tasks with its corresponding beginning and end states; a sequence construction mechanism configured to construct, based on the task database, a plurality of possible sequences of tasks; a search engine configured to select one among said plurality of possible sequences that starts from a given beginning state of the machine and results in a desired end state of the machine; and a controller configured to control said machine to perform the selected possible sequence.

A further embodiment of the invention is a lithographic processing cell that comprises a plurality of lithographic processing machines and a control system. At least one of said lithographic processing machines is capable of performing a plurality of tasks and configured to have a plurality of states over time, each of the plurality of tasks being associated with a corresponding beginning state of the plurality of states, in which the machine is configured to initiate the task, and a corresponding end state of the plurality of states, in which the machine is configured to complete the task. The control system is configured to operate said at least one of the plurality of lithographic processing machines, and it comprises a state register configured to represent a state of the machine at a corresponding time; an update mechanism configured to update said state register according to a change in the state of the machine over time; a task database configured to store information relating each of the plurality of tasks with its corresponding beginning and end states; a sequence construction mechanism configured to construct, based on the task database, a plurality of possible sequences of tasks; a search engine configured to select one among said plurality of possible sequences that starts from a given beginning state of the machine and results in a desired end state of the machine; and a controller configured to control said machine to perform the selected possible sequence, wherein said plurality of lithographic processing machines includes a lithographic apparatus and a track unit.

A further embodiment of the invention is a data storage medium having machine-executable instructions, said instructions describing a method of operating a lithographic processing machine capable of performing a plurality of tasks and configured to have a plurality of states over time, each of the plurality of tasks being associated with a corresponding beginning state of the plurality of states, in which the machine is configured to initiate the task, and a corresponding end state of the plurality of states, in which the machine is configured to complete the task. The method comprises maintaining a state register representing a state of the machine at a particular time; providing a task database relating each of the plurality of tasks with its corresponding beginning and end states; based on the task database, constructing a plurality of possible sequences of tasks; selecting one among said plurality of possible sequences that starts from a given beginning state of the machine and results in a desired end state of the machine; and controlling the machine to perform the selected possible sequence.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 29 shows a task precedence graph; and

DETAILED DESCRIPTION

At least some embodiments of the present invention may be applied to provide an improved method of operating lithographic apparatus and lithographic processing cells, which allows on-the-fly scheduling including the possibility to recover from unforeseen errors.

Figure 1:
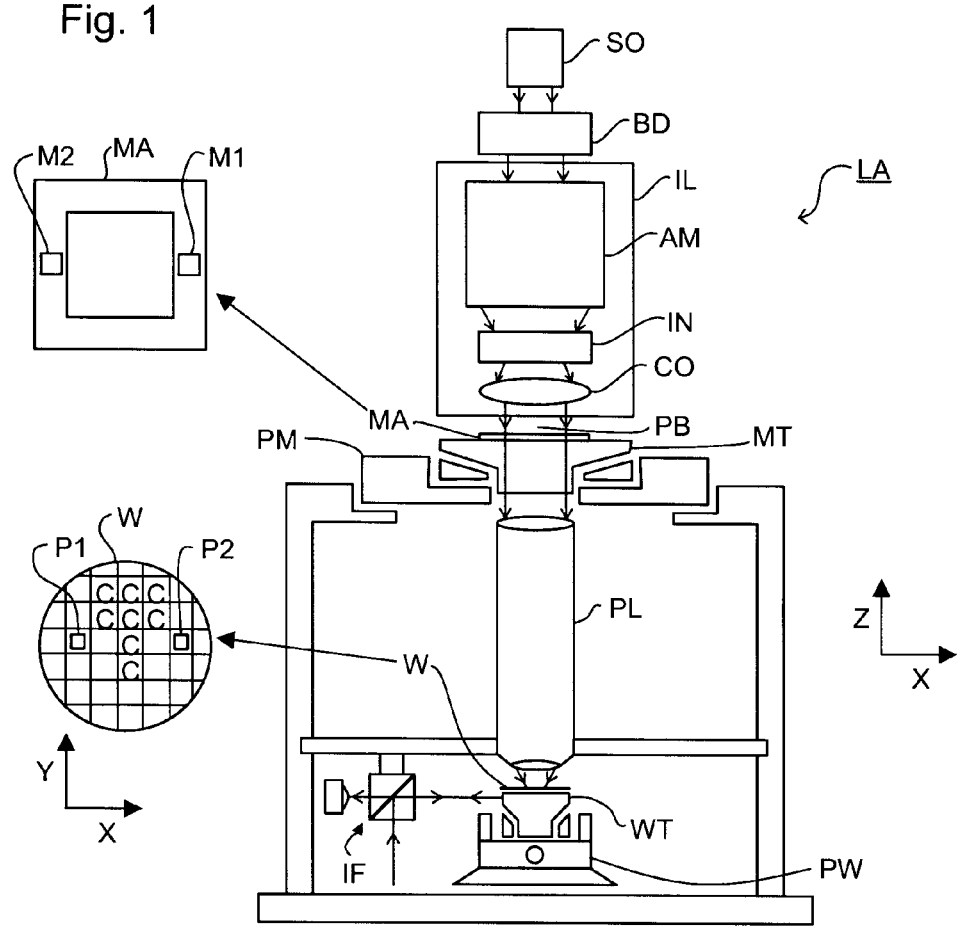
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation or DUV radiation).

a first support structure (e.g. a mask table) MT for supporting patterning structure (e.g. a mask) MA and connected to a first positioning device PM for accurately positioning the patterning structure with respect to item PL;

a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by patterning structure MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB.

Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 2:
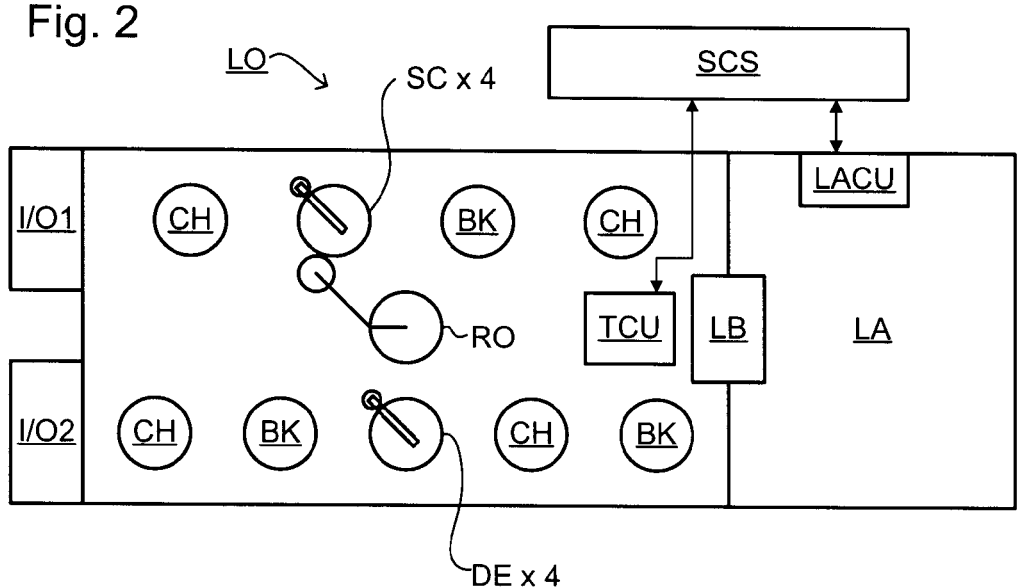
FIG. 2 depicts a lithographic processing cell according to an embodiment of the invention.

The lithographic apparatus LA shown in FIG. 1, forms part of the lithographic processing cell, or lithocell, LO shown in FIG. 2. As well as the lithographic apparatus LA, the lithocell LO includes input/output ports I/O1 and I/O2 (a single port or more than two may also be provided), chiller plates CH for cooling substrates, bake plates BK for heating substrates, spin coaters SC (typically four) for coating substrates, e.g. with resist, developers (again typically four) and a substrate handler, or robot, RO for moving substrates between the various devices and the loading bay LB of the lithographic apparatus LA. The aforementioned devices are generally referred to collectively as the track and are controlled by a track control unit TCU so as to process substrates according to the appropriate recipe. Typically, substrates are taken in at one of the ports I/O1 or I/O2, cooled on a chiller plate CH, coated with resist using a spin coater SC, given a pre-exposure bake on a bake plate BK to drive off excess solvent in the resist and cooled again before being exposed by the lithographic apparatus LA. After exposure, the substrates are subjected to a soft bake, cooled, developed, hard baked and cooled again before being output via one of the ports.

Logistics

Figure 3:
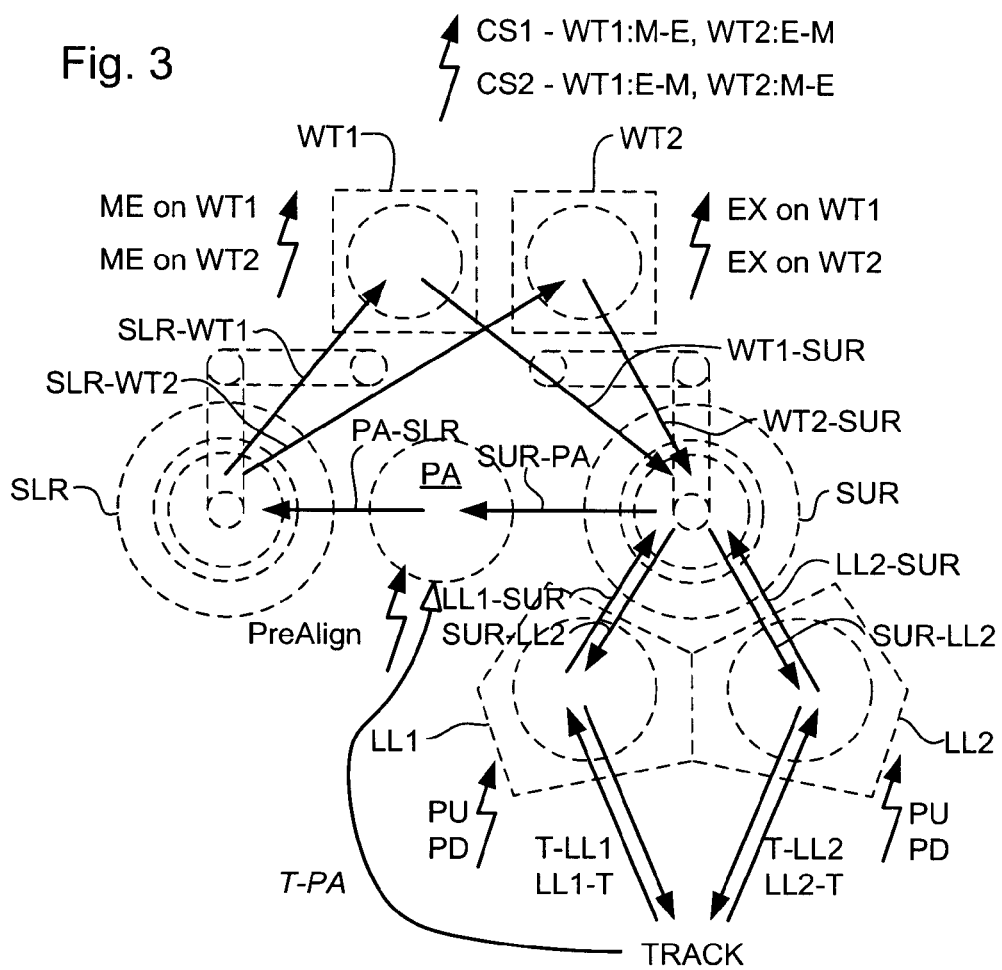
FIG. 3 depicts the wafer handling arrangements in an apparatus embodying the invention and certain tasks that may be performed by the apparatus.

By way of an exemplary implementation of the invention, FIG. 3 shows the wafer handling arrangements in the lithographic apparatus of FIG. 1 together with the tasks that are performed in process of exposing a layer on a substrate. Some of these tasks may be regarded as task clusters as they can be broken down into smaller tasks but for the purposes of the present explanation no distinction between task clusters and tasks need be made.

In FIG. 3, the components of the apparatus, also referred to as resources, are indicated in dashed lines, transportation tasks are indicated by straight arrows and process tasks by zigzag arrows.

The lithographic apparatus LA has two load locks LL1, LL2 through which wafers are loaded into the apparatus and which are pumped up or down between ambient pressure and the vacuum level required for exposure. A first substrate handling device SUR transfers substrates from the load locks LL1, LL2 to a pre-alignment station PA, which performs a pre-alignment process known in the art. From there, the substrates are picked up by a second substrate handling device SLR and transferred to one of the two substrate tables WT1, WT2. The substrate tables WT1, WT2 each take a substrate to a measurement station to perform a known measurement process, then to an exposure station for the known exposure process and finally the substrates are picked from the substrate table by the first substrate handling device SUR and transferred to one of the load locks LL1, LL2. The substrate handler RO (not shown in FIG. 3) of the track unit loads the substrates into and out of the load locks LL1, LL2.

The state of the machine is represented by registering, for each resource, whether there is a substrate present, and if so which substrate, and, for each substrate, in which manufacturing process state it is and how many attempts have been performed to try to progress it to the next stage. Additionally, the resource states are registered, for example whether the load locks LL1, LL2 are at vacuum or not and the positions of the substrate tables WT1, WT2. Four manufacturing process states are distinguished: blank, pre-aligned, measured and exposed. To complete the exposure process for one substrate it must progress from blank to exposed states and travel through the lithographic apparatus.

As mentioned above, two types of task are distinguished. A process task does not move a substrate from one resource to another but does change its state. For example, the pre-alignment task PreAlign changes the state of the substrate from blank to pre-aligned, the measurement task ME changes the substrate state from pre-aligned to measured and the expose task EX changes it from measured to exposed. A transport task moves a substrate from one resource to another but does not change its state. For example, the task SUR-PA moves as substrate from the first substrate handling device SUR to the pre-aligner PA. Thus the following pre- and post-conditions are defined for the two types of task:

TABLE 1

| | | Condition |
|---|---|---|
| Process | pre: | at certain resource, with material (id/state/retry): (any/x/<r) |
| | post: | at same resource, with material (same/x + 1/0) |

TABLE 1-continued

| | | Condition |
|---|---|---|
| Transport | pre: | at 'from' resource f, there is a material (any/any/any) |
| | | at 'to' resource t there is no material |
| | post: | at resource f there is no material |
| | | at resource t there is material (same/same/same) |

The above assumes that each resource is capable of holding only one material (substrate) but can readily be modified for resources capable of holding multiple items.

Figure 4:
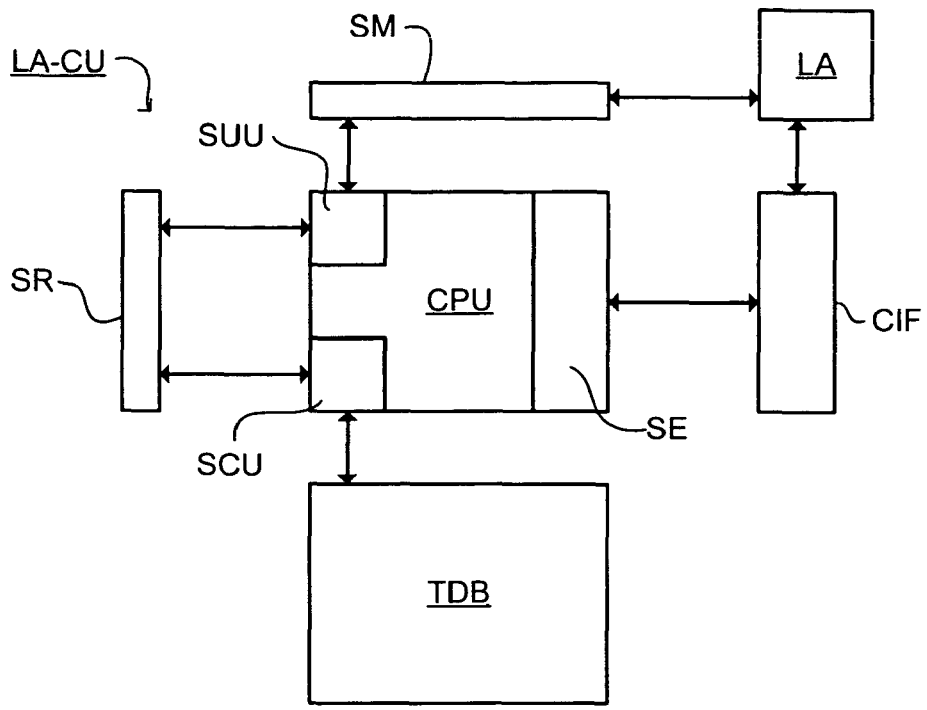
FIG. 4 depicts a control system for the lithographic apparatus of FIG. 1.

The control system LA-CU for the lithographic apparatus LA is shown in FIG. 4. A state monitor SM monitors the state of the lithographic apparatus, for example the location and states of substrates in it, and reports changes to the state updating unit SUU of the CPU of the control system. The state updating unit SUU maintains a state register SR, which represents the state of the "machine", in this embodiment the relevant parts of the lithographic apparatus LA. A task database TDB contains information about possible tasks (or task clusters) that may be carried out by the machine, including at least data representing the pre- and post-conditions for each task. It will be appreciated that the pre- and post conditions of a task may only involve certain parameters of the machine state—other parameters are "don't care" in the pre-conditions and unchanged in the post-conditions. A "metatask" may be regarded as a task in the abstract, characterized by it's pre- and post-conditions and recorded in the database whereas a task is an instantiation of a metatask, carried out on a specific material, or from a specific beginning state to a specific end state.

To determine a schedule for processing a wafer, possible sequences of tasks that can be carried out are constructed by sequence constructing unit SCU, referring to the task database TDB. It will be appreciated that task A may be followed in a sequence by task B if the pre-conditions of task B match the post conditions of task A. A selector SE, e.g. a search engine, then selects (from the various sequences of tasks constructed by the sequence constructor) a sequence whose pre-conditions match the given beginning state of the machine, e.g. blank substrate in the Track, and whose post-conditions match the desired end state, e.g. an exposed wafer in the Track. Where multiple sequences match these criteria, one may be selected that is optimum according to a given criteria, e.g. shortest execution time. Control interface CIF applies the selected sequence to the apparatus LA.

To increase the efficiency of generation of possible sequences, various approaches and algorithms may be employed. The sequences may be constructed starting from the given beginning state or backwards from the desired end state. Rules may be used to determine the tasks added to a sequence. Loops in sequences may be detected and the corresponding sequences rejected. A sequence of tasks that is frequently used may be combined to form a task cluster, that is stored in the database as if it were a task. Thus, the tasks T-LL1, PD, LL1-SUR, SUR-PA might be combined to form task cluster T-PA.

It should be appreciated that the decision as to whether the various parts of the control system (e.g. state monitor SM, state updating unit SUU, state register SR, sequence constructing unit SCU, selector SE, control interface CIF, task database TDB) are implemented in hardware (e.g. as a hard-wired circuit and/or as a circuit configuration fabricated into an application-specific integrated circuit) and/or software (e.g. machine-readable code, such code being instructions executable by an array of logic elements such as a microprocessor or other digital signal processing unit), and as to whether the state register and task database are stored in the same or separate storage devices (e.g. one or more semiconductor or ferroelectric memory units or magnetic or phase-change media such as disks (floppy, hard, CD, DVD, ROM or RAM)), is a matter of convenience in a particular embodiment of the invention. Also, the operations of constructing possible sequences of tasks and then selecting a sequence may be conducted sequentially, that is a plurality of sequences are generated and then searched for one meeting the relevant criteria, or in parallel, e.g. each sequence generated is tested against the relevant criteria as it is generated. In the latter approach, the generation of possible sequences may be halted as soon as a match is found or continued, if there is still the possibility of generating other possible sequences, to find multiple solutions which may then be selected from.

Metrology

The invention can also be applied in other parts and processes of the apparatus. A further example, described below, is metrology, specifically the mask alignment process which may form part of the measurement (meta)task mentioned above.

A lithographic apparatus may be required to operate at nanometer accuracy. Since the apparatus cannot in general be manufactured to that accuracy and the substrate geometry deviates from nominal by more than this, it may be necessary to carry out various measurements and calibration operations to compensate for the deviations from nominal of the apparatus hardware and the substrates being processed.

The process that effects this compensation is referred to as metrology and typically takes into account the limitations of the hardware that can measure deviations. This can be accomplished using models involving several related coordinate systems and other geometric relations. Compensation or calibration operations (tasks) are done during machine set-up (e.g. to compensate for manufacturing deviations), between lot processing (e.g. for drifts) and during lot processing (e.g. to align to substrates).

Due to the complexity of the metrology models and the inter-dependencies of the calibrations, determination of feasible calibration sequences is difficult. Determination of (efficient) recovery sequences for all possible exceptional states is even more difficult.

For the purpose of this embodiment of the present invention, the system state is defined by determining, from the applicable metrology models, a set of applicable parameters. The accuracy of these parameters (aspects) can be categorized in discrete levels, for example. The system state describes the accuracy level of all applicable parameters.

Figure 5:
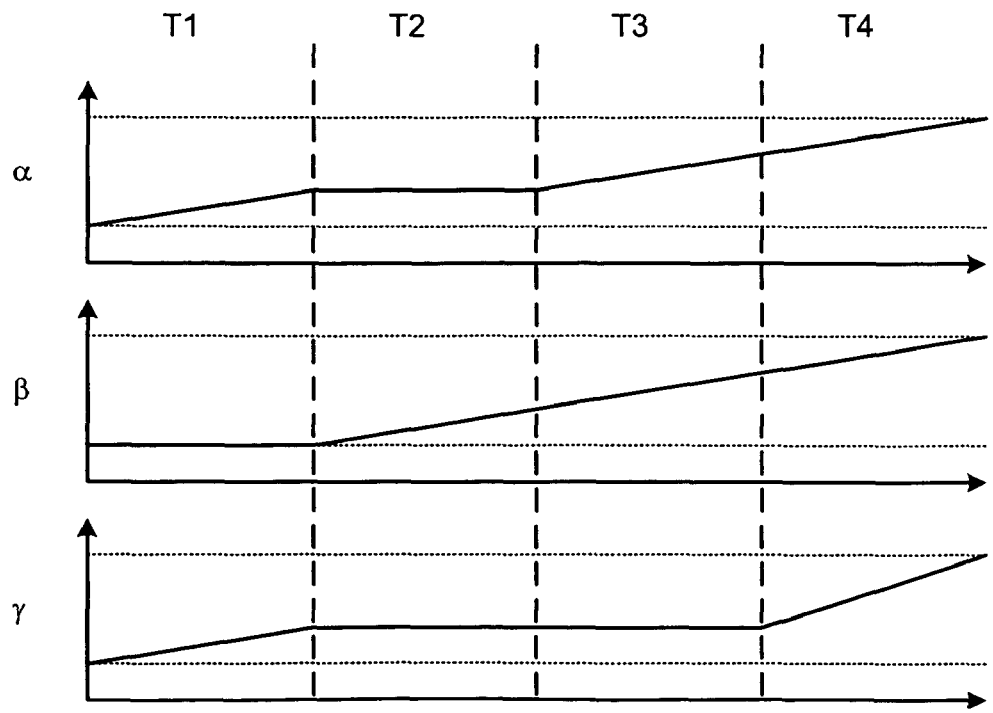
FIG. 5 depicts accuracy of four parameters during a metrology sequence.

During a metrology sequence, the accuracies of the different parameters increases, as shown in FIG. 5 by way of a simplified example. Task T1 increases the accuracy of parameters α and γ by a certain amount, then task T2 increases the accuracy of β, etc. until all parameters are at the desired level or accuracy.

Two types of (meta)tasks can be distinguished, measurements, i.e. a operation involving a measurement of a physical quantity, and model operations, which involve mathematical calculations, e.g. based on the results of measurement tasks. A blue print for the pre- and post-conditions for these two types of task is as follows:

TABLE 2

| TASK TYPE | PRE-CONDITION | POST-CONDITION |
|---|---|---|
| Measurement | actual accuracy of relevant parameter worse than required | accuracy improved to some level |
| Model | actual accuracy of one or more parameters less than that of one or more related parameters | actual accuracy of all related parameters is equivalent |

In some cases, additional pre-conditions specifying the order that some tasks are carried out may be required.

Figure 6:
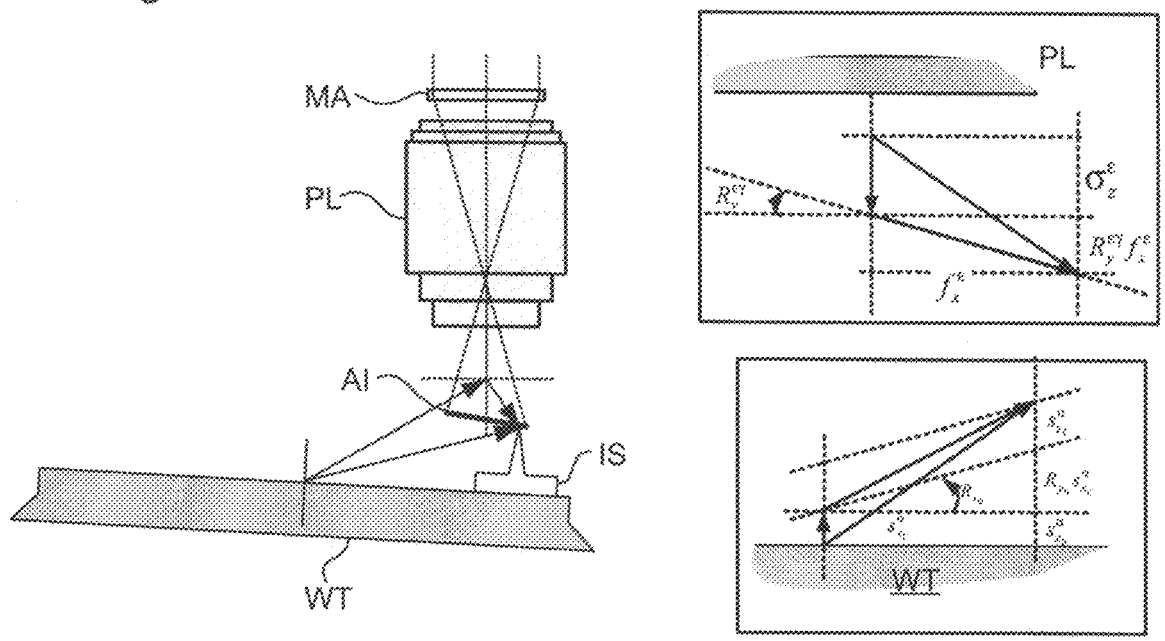
FIG. 6 depicts part of a lithographic projection apparatus and the parameters determined during a mask alignment process.

By way of an example, FIG. 6 shows some parameters involved in the vertical part of a mask alignment process using an image sensor IS to measure the position of an alignment mark in the aerial image AI of the mask MA. The symbols in FIG. 6 indicate the following:

Metro Frame coordinate system or wafer stage zeroing coordinate system (WZ_CS) with base $\vec{\epsilon} = (\vec{e}_x, \vec{e}_y, \vec{e}_z)$.

Vector $\vec{f}$ from the WZ_CS origin to the image point to be measured, and ε-coordinates $(f_x^\epsilon, f_y^\epsilon, f_z^\epsilon)$ of the vector $\vec{f}$.

Lens to metro frame height $\sigma_z^\epsilon$.

Lens to metro frame Y-tilt $R_y^{\epsilon\gamma}$.

Substrate table coordinate system (WT_CS) with base $\alpha = (\vec{\alpha}_x, \vec{\alpha}_y, \vec{\alpha}_z)$.

Vector $\vec{s}$ from the WT_CS origin to the WZ_CS origin, and α-coordinates $(s_{x_C}^\alpha, s_{y_C}^\alpha, s_{z_C}^\alpha)$ of the vector $\vec{s}$.

Wafer stage zeroing height error $s_{z_0}^\alpha$.

Wafer stage zeroing Y-tilt error $R_{y_0}$.

Figure 7:
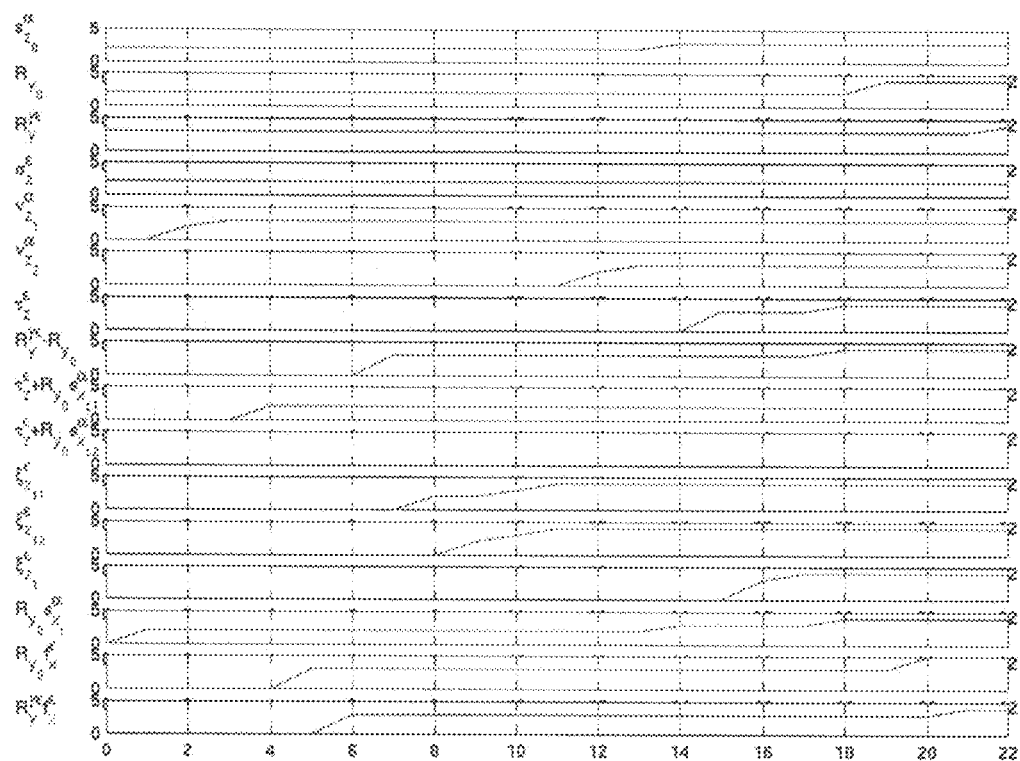
FIG. 7 depicts accuracy levels of various parameters during a mask alignment process.

FIG. 7 shows a sequence of acts to raise the accuracy of the relevant parameters to the desired levels generated using an embodiment of the invention. Symbols in FIG. 7 indicate the following:

Zeroing error-induced height offset $v_z^\alpha$.

Apparent lens-to-metro frame height offset $\tau_z^\epsilon$.

Image point height in lens coordinate system (LCS) $\xi_z^\epsilon$.

By allowing the state register to recognize exception states, the present invention can enable error recovery, including from unforeseen errors. The task database should include tasks that are of use in an error-recovery mode of the machine (such as re-initialization or resetting tasks), calibration tasks and tasks performed in system start-up. Special error recovery tasks can also be created.

An additional approach to the recovery of errors is also possible with the invention. If a task fails, resulting in the exception state, one possible cause is that the machine state did not actually match the task pre-conditions even if the state register indicated that it did. Thus, tasks can be performed that refresh the machine parameters relevant to the pre-conditions of the task, for example calibrations of relevant measurement systems or re-initializations of software subroutines. It is especially advantageous that these operations can be initiated without operator intervention and even if unsuccessful in correcting the error may provide useful diagnostic information. A successful recovery can be recorded for future use in case of recurrence of the problem.

A further development of the invention is to consider the past history of the device and adapt the processes performed accordingly. For example, a lithographic apparatus may have two standard procedures for establishing the vertical position of the mask, or its aerial image—a robust "good weather" procedure that starts with assumed accuracy levels of relevant parameters to almost always capture the mask position and a "worst weather" procedure that starts from minimum assumptions about accuracy levels and positions and is designed to capture the mask position where ever it may be but takes longer than the "good weather" procedure. As an example, the range of an acquisition scan may be much greater in the worst weather procedure than in the good weather procedure. If the apparatus is performing well, even the good weather procedure may involve unnecessary operations or unnecessarily broad acquisition scan ranges. The present invention can be used to construct task sequences that start from higher levels of assumed accuracy and are performable more quickly. On the other hand, if the good weather procedure consistently fails it may be that the worst possible weather procedure steps too far back and that assuming a lower accuracy level in only one or a few parameters can acquire the desired value. Thus the invention can be used to construct sequences intermediate the good and worst weather procedures, based on results obtained when the worst weather procedure has been invoked.

Also, the choice of sequence to follow may take into account the probability of failure in individual tasks carried out or in the sequence as a whole. For example if selection of a task sequence is based on the time taken to execute a sequence, the time that sequence is predicted to take may be adjusted by the product of the probability of failure and the time taken to recover from a failure. Alternatively, if failure would result in irrecoverable damage to the machine or a substrate, a sequence of task with a too high probability of failure might be forbidden. Probabilities of failure may be derived from empirical data, theoretical calculations or both.

Figure 8:
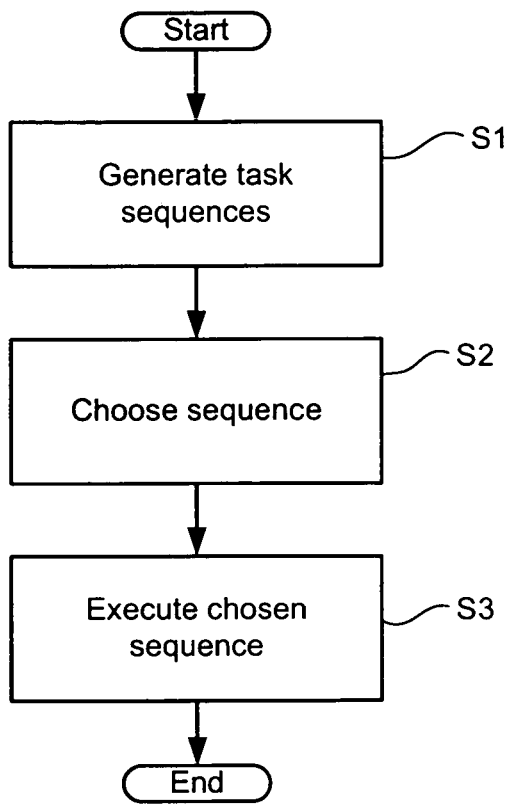
FIG. 8 is a flow diagram of a method according to the invention.

FIG. 8 is an overall flow diagram of a method according to an embodiment of the present invention. First, task sequences are generated S1, then a sequence is chosen from the generated sequences according to desired criteria, e.g. speed of execution or probability of success, and finally the machine is controlled to execute the desired sequence. It should be noted however that the operations according to this embodiment of the invention need not be performed strictly sequentially. For example the generation of task sequences and the selection of a sequence may be carried out in parallel, with each generated task sequence tested against the selection criteria. At that point generation of sequences may stop whilst the selected sequence is executed. However, it is also possible for the generation of task sequences to continue whilst a task sequence is being executed so that if a better sequence is generated that might be executed in place of the previously selected sequence. In such a case, the beginning state for the generation of sequences may need to be updated in real time.

Figure 9:
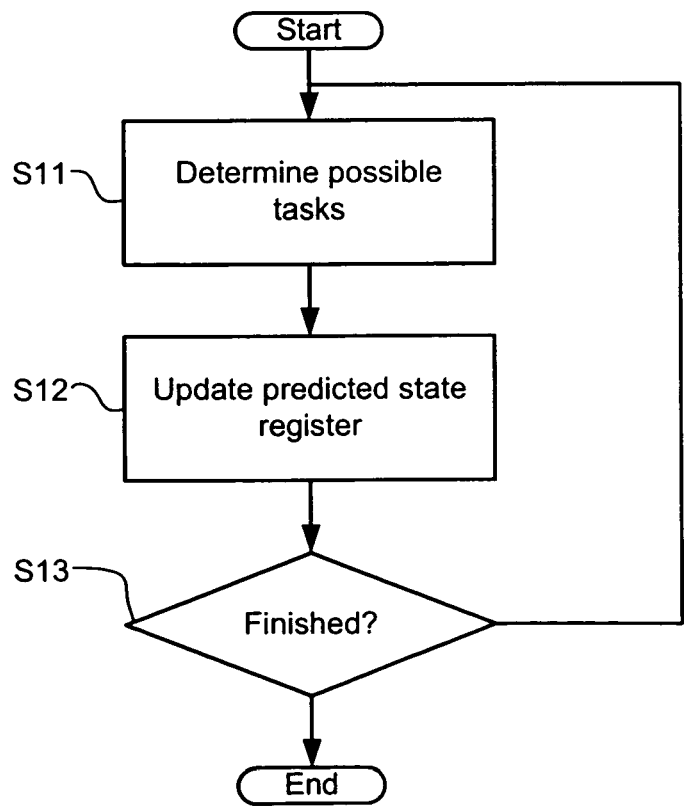
FIG. 9 is a flow diagram of a process for constructing sequences in a method according to the invention.

A process for generating a sequence of tasks is shown in FIG. 9. Starting from the begin state for the sequence, a possible task (that is, a task whose pre-conditions match the begin state) is determined S11, then a predicted state register (which is identical to the actual state register but records a predicted state) is updated according to the post conditions of the determined task S12. It is then decided S13 whether the generation of the sequence is complete and if not another iteration of operations S11 and S12 is carried out using the predicted state register. The procedure may be repeated to generate another sequence. In place of such a depth first sequence generation process, a breadth first approach using multiple predicted state registers may be used. Either type of approach may be used working backwards from the desired state.

In a third embodiment of the invention, the lithographic apparatus is considered as a task resource system (TRS). Tasks can be associated with manufacturing processes, whereas resources can be associated with mechatronic systems. Transforming a manufacturing request into machine behavior can be structured in three phases. First, a scheduling problem must be instantiated from the manufacturing request, taking into account the limitations of the machine. This transformation is called instantiating. The structure of the resulting scheduling problem shows many similarities with the job shop scheduling problem. The manufacturing process of a material instance can be associated with a job, whereas the different parallel mechatronic systems can be associated with the different machines in a job shop. Subsequently, resources must be assigned to the tasks in the instantiated scheduling problem in some order, taking into account the fact that resources are able to perform certain tasks only, and only one at a time. This transformation is called selecting. The selected order of tasks to be performed by selected resources implies consecutive state transitions of those resources, which is analogous to the setup times for mode switching in job shop scheduling. Finally, start and finish times can be assigned to the tasks, taking into account the speed of the resources. This transformation is called timing.

During the three transformation phases of instantiating, selecting and timing, choices must be made. The result of a choice in a certain transformation on the machine behavior can only be evaluated by performing the consecutive transformations. Therefore, a transformation phase strongly relies on information from subsequent phases. The layered TRS framework shown in FIG. 10 displays the hierarchically related transformation phases as functionality layers (A through C) and the different TRS definition levels (0 through 3) as interfaces between the layers.

Figure 11:
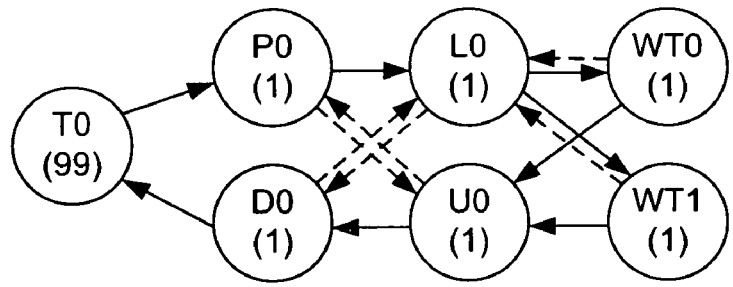
FIG. 11 shows a schematic layout of a dual-stage substrate scanner.

The primary manufacturing process of a substrate scanner is the exposure of a mask containing an IC pattern onto substrates. FIG. 11 shows a schematic layout of a dual-stage substrate scanner. In this figure, circles depict the mechatronic subsystems or resources regarded here, and arrows depict the possible transport paths. The number of material instances (substrates) that a resource can carry is depicted between brackets. At the right side of the figure, the two substrate tables that are present in a dual-stage substrate scanner (WT0 and WT1) are depicted, that carry the substrate during exposure. As the required accuracy of the exposure process is very high, any imperfections concerning the substrates must be corrected for. To be able to do this, substrates are measured at a substrate table before being exposed. There are separate measure and expose stations in the machine. The orientation of the substrate at a substrate stage is of importance for successful measurement and exposure, whereas the orientation is unknown when a substrate comes into the machine. Therefore, a pre-alignment unit (P0) is incorporated. A neighboring machine named track (T0) performs some pre-processing and post-processing operations, and delivers substrates to the alignment system. A load robot (L0) transports substrates between the pre-alignment system, the substrate tables and the discharge unit. An unload robot (U0) can do the same, but cannot transport substrates to the substrate tables. Loading onto and from a substrate table is only possible if it is at the measure station of the machine. From the discharge unit (D0), substrates are picked up by the track.

Figure 12:
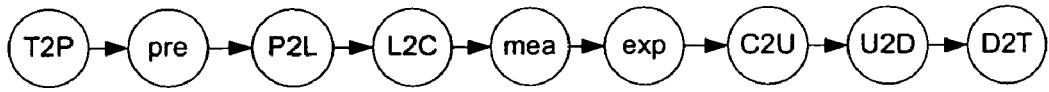
FIG. 12 depicts a precedence graph of the life of a substrate.

The operations in the manufacturing process of a substrate ('life of a substrate') are as follows. First, the substrate is transported from the track onto the pre-alignment unit (T2P). Subsequently, the pre-alignment takes place (pre). After that, the load robot takes the substrate from the alignment unit (P2L), and places the substrate onto a substrate table (L2C). On the substrate table, the substrate is measured (mea) and, subsequently, exposed (exp). Then, the unload robot takes the substrate from the substrate table (C2U) and puts the substrate onto the discharge unit (U2D). Finally, the substrate is taken from the discharge unit by the track (D2T). A precedence graph of the life of a substrate is depicted in FIG. 12.

Two types of manufacturing operations can be distinguished in the life of a substrate: process operations and transport operations. Process operations take place at one location, whereas transport operations move a substrate from one location to another and are depicted as arrows in FIG. 11. However, FIG. 11 contains also dashed arrows. These arrows concern transportation possibilities that are not involved in the fair weather life of a substrate, but can be useful for recovery purposes. In any case, it is important that substrates leave the machine in the same order as they entered it (FIFO).

The scheduling model for the present embodiment can be defined by a 12-tuple ($\mathcal{T}_2$, $\mathcal{R}$, C, $I_2$A, $P_2$, $Pt_2\mathcal{M}$, $Cb_2Ce_2$, Rm, Mf);

$\mathcal{T}_2$ is a finite set of elements called tasks.

$\mathcal{R}$ is a finite set of elements called resources.

C is a finite set of elements called capabilities $I_2$:$\mathcal{T}_2 \to \mathcal{P}(C)$ gives the set of capabilities that are involved in a certain task.

A:C$\to \mathcal{P}(\mathcal{R})$ gives the set of resources that are available for a certain capability.

$P_2 \subseteq \mathcal{T}_2 \times \mathcal{T}_2$ is the precedence relation between tasks.

$Pt_2 \to \mathcal{T}_2 \times \mathcal{T}_2$ is the tied precedence relation between tasks.

$\mathcal{M}_2$ is a finite set whose elements are called material instances.

$Cb_2$, $Ce_2$:TC$\to \mathcal{P}(\mathcal{M})$ give the begin and end material configuration of each capability involved in a certain task, where TC={(t,c)|$\in \mathcal{T}_2$,c$\in I_2$(t)}

Rm: $\mathcal{R} \to \mathbb{N}$ gives the number of material instances that can reside on a certain resource.

Mf$\subseteq \mathcal{R} \to \mathcal{R}$ represents the physically possible material flow as a set of tuples defining from which resource to which resource material can flow.

The scheduling model in this embodiment can be split into two sections: system-dependent elements and work-dependent elements. The system dependent elements can be instantiated using FIG. 11 as follows.

There are six capabilities: the substrate table, the load and unload robots, the alignment and discharge units, and the track.

C={C, L, U, P, D, T}

There are seven resources: one for each capability, except two substrate tables.

$\mathcal{R}$ ={C0, C1, L0, U0, P0, T0}

The available resources for each capability are defined as follows:

A={(C, {C0, C1}), (L, {L0}), (U, {U0}), (P {P0}), (D {D0}), (T, {T0})}.

The material capacity of the resources is one for each resource, except for the track, the pod, and the buffer:

Rm={(C0,1), (C1,1), (L0,1), (U0,1), (P0,1), (D0,1), (T0,99)}

The possible material flow is defined as follows:

Mf={(T0, P0), (P0, L0), (L0, C0), (L0, C1), ... }

Figure 13:
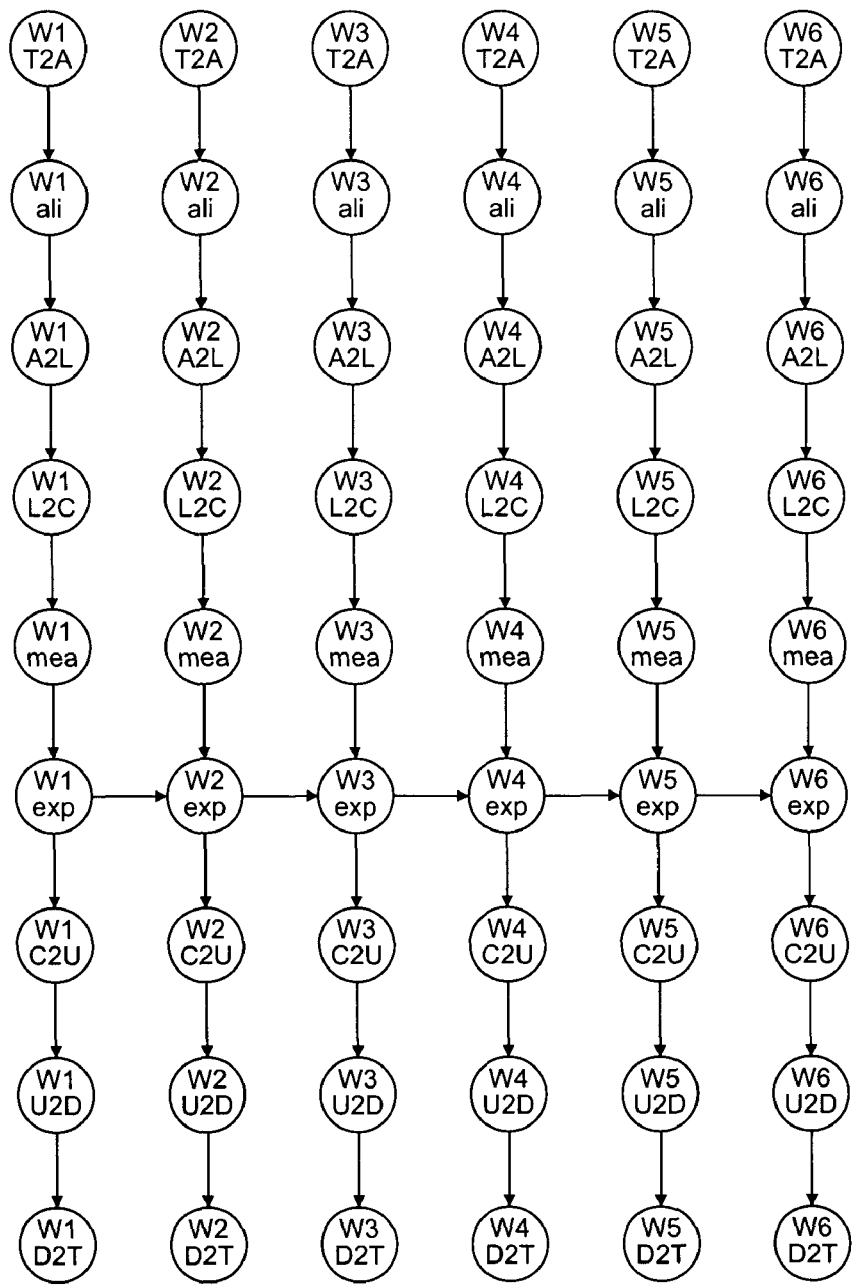
FIG. 13 depicts a precedence graph for a lot of substrates.

As an example, a batch or lot of six substrates, W1 to W6, is processed. The precedence graph for this lot is depicted in FIG. 13. It consists of six substrate lives, of which the first and the 'exp' stages are connected with precedence edges to ensure FIFO processing. The work-dependent elements for such a lots can be instantiated as follows:

$\mathcal{T}_2$={W1–T2P, W1–pre, ..., W2–T2P, W2–pre, ... }.

$I_2$={(W1–T2P, {T,P}), (W1–pre, {P}) ... }.

$P_2$={(W1–T2P, W1–pre), (W1–pre, W1–P2L), ..., (W1–T2P, W2–T2P), (W2–T2P, W2–pre), ... }.

$Pt_2$={ }. –$\mathcal{M}_2$={W1, W2, W3, W4, W5, W6}.

$Cb_2$={((W1–T2P, T), {W1}), ((W1–T2P, P), { }), ((W1–pre, P), {W1}), ... }.

$Ce_2$={((W1–T2P, T),{ }), ((W1–T2P, P),{W1}), ... }.

Figure 14:
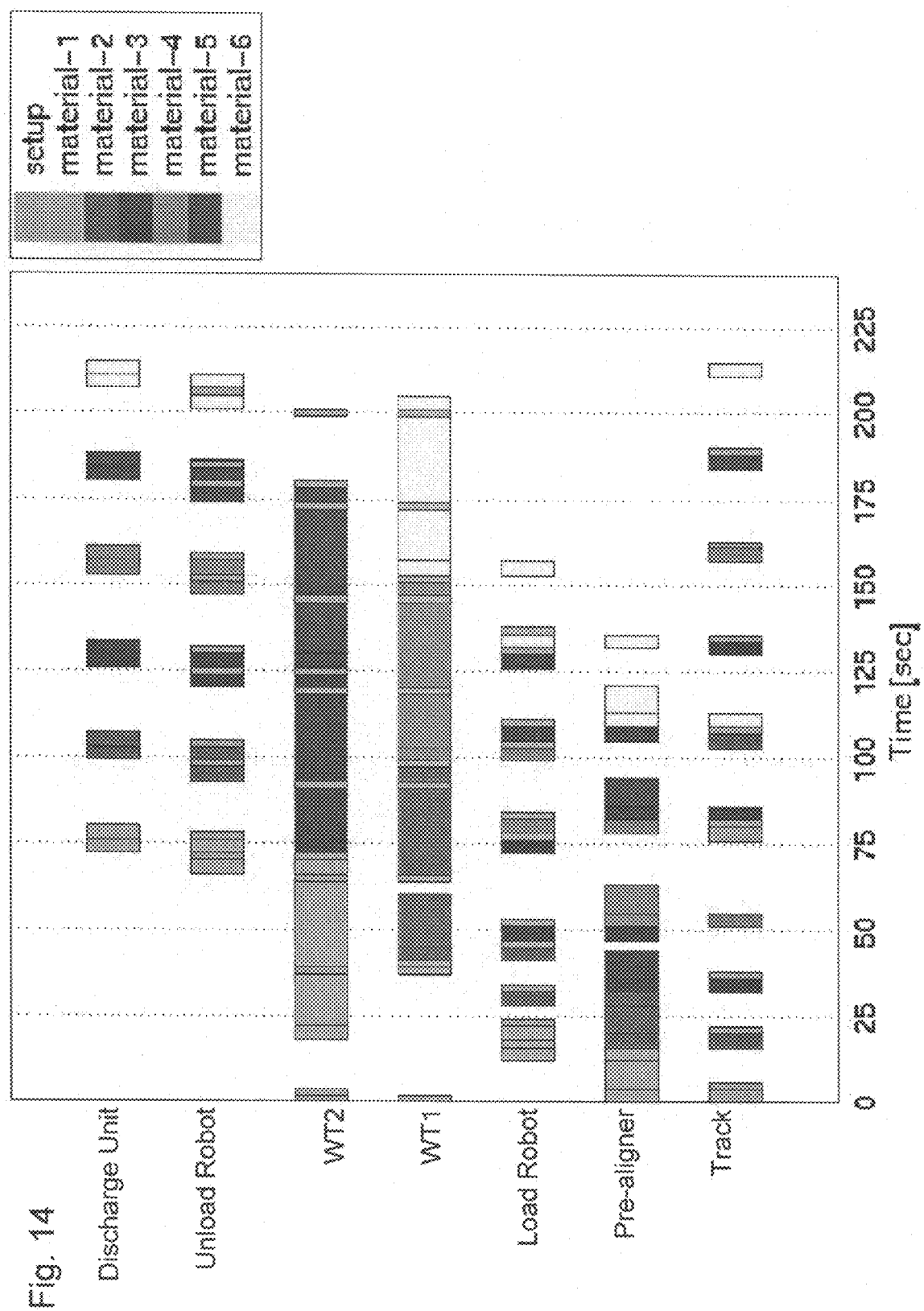
FIG. 14 shows a schedule for a lot of substrates.

A schedule for this lot is shown in FIG. 14.

Whereas tasks in an instantiated TRS (see FIG. 10) have material instances assigned to them and a precedence relation, this is not the case for an uninstantiated TRS. Tasks can be instantiated from so-called metatasks. Metatasks can be associated with the possible manufacturing operations described in the previous section. Although there is no precedence relation between metatasks, constraints exist for instantiating metatasks, ensuring that the resulting instantiated TRS definition is feasible. Instantiation of a transport operation or metatask is only possible if there is material available at the 'from' location, and there is enough room at the 'to' location. For example: picking up a substrate from the alignment unit by a robot is only possible if there is a substrate at the alignment unit, and the robot has no substrate yet. Furthermore, a process can only succeed if a substrate is at the right location in the right state. For example: measuring an aligned substrate at a substrate table. For the purpose of this paper, the following is assumed:

1) Resources r; r' of the same capability c are 'equivalent': they have the same material capacity (Rm) and logistic connections (Mf). Furthermore, transportation of material between resources of the same capability is not possible.

These constraints can be defined as follows.

$$(\forall c, r, r' : c \in C, r, r' \in A(c) \qquad (1)$$
$$: Rm(r) = Rm(r')$$
$$\wedge (\forall r'' : (r'', r) \in Mf : (r'', r') \in Mf)$$

-continued $\wedge (\forall\, r'' : (r, r'') \in Mf : (r, r'') \in Mf)$ $\wedge (\forall\, (r, r') \notin Mf \wedge (r', r) \notin Mf)$

)

As a consequence, a capability can be regarded as a material location.

The manufacturing phases of a material instance can be expressed using linear, unit-distant material manufacturing phase identifiers $S_m \subseteq \mathbb{N}$. These identifiers and their description are as follows for the wafers in the example:
- 0: fresh
- 1: pre-aligned
- 2: measured
- 3: exposed Under these assumptions, the system state can be defined by $|Ssys|: C \rightarrow \mathcal{P}(\mathcal{M} \times S_m)$ describing for each capability which material instances reside on it and their manufacturing phase. Based on this system state, the definition elements concerning the metatasks of the uninstantiated TRS definition can be formulated:

$\mathcal{T}_3$ is a finite set of uninstantiated tasks or metatasks.

$I_3: \mathcal{T}_3 \rightarrow \mathcal{P}(C)$ gives the set of capabilities that are involved in a certain metatask.

$Cb_3, Ce_3: TC \rightarrow \mathcal{P}(\mathbb{N} \times S_m)$ give the pre-condition at the beginning and expected post-condition at the end of a metatask, where $TC=\{(t,c)|t\in\mathcal{T}_3, c\in I_3(t)\}$. The conditions are defined by a tuple involving capability, the number of material instances involved, and their manufacturing phase.

In case of a process metatask, the begin number of material instances and their manufacturing phase form the pre-condition for instantiating. The end manufacturing phase defines the manufacturing phase of a material instance resulting from the metatask, e.g. the pre-alignment metatask 'pre': $Cb_3$('pre','P')=(1,0), $Ce_3$('pre','P')=(1,1).

In case of a transport metatask, only the begin and end numbers of material instances for the instantiating pre-condition. The manufacturing phase of material after transport depends on the manufacturing phase before transport. It remains unchanged if the manufacturing phase was equal to the required begin manufacturing phase (pre-condition), and is reset to the end manufacturing phase (post-condition) if not. For example the conditions of metatask 'C2U' that describes that a substrate is transported from a chuck to the unload robot, and keeps its manufacturing phase only if this was phase 3 ('exposed'): $Cb_3$('C2U','C')=(1,3), $Cb_3$('C2U','U')=(0,0), and that it is reset to 0 if not $Ce_3$('C2U','C')=(0,0), $Ce_3$('C2U','U')=(1,0). So e.g. a 'measured' substrate (phase<3) becomes 'fresh' (phase 0) when it is transported from a substrate table to the unload robot. Table I gives an overview of all pre- and post conditions of the metatasks in the example.

TABLE I

PRE-CONDITIONS AND EXPECTED POST-CONDITIONS.

| metatask, capability (t; c) | pre-condition $Cb_3$(t; c) | post-condition $Ce_3$(t; c) |
|---|---|---|
| (pre; P) | (1, 0) | (1, 1) |
| (P2L; P) | (1, 0) | (0, 0) |
| (P2L; L) | (0, 0) | (1, 0) |
| (L2C; L) | (1, 0) | (0, 0) |

TABLE I-continued

PRE-CONDITIONS AND EXPECTED POST-CONDITIONS.

| metatask, capability (t; c) | pre-condition $Cb_3$(t; c) | post-condition $Ce_3$(t; c) |
|---|---|---|
| (L2C; C) | (0, 0) | (1, 0) |
| (mea; C) | (1, 1) | (1, 2) |
| (exp; C) | (1, 2) | (1, 3) |
| (S2UR; S) | (1, 3) | (0, 0) |
| (C2U; U) | (0, 0) | (1, 0) |
| (U2D; U) | (1, 0) | (0, 0) |
| (U2D; D) | (0, 0) | (1, 0) |
| (L2P; L) | (1, 0) | (0, 0) |
| (L2P; P) | (0, 0) | (1, 0) |
| (D2U; D) | (1, 0) | (0, 0) |
| (D2U; U) | (0, 0) | (1, 0) |
| (P2U; P) | (1, 0) | (0, 0) |
| (P2U; U) | (0, 0) | (1, 0) |
| (U2P; U) | (1, 0) | (0, 0) |
| (U2P; P) | (0, 0) | (1, 0) |
| (D2L; D) | (1, 0) | (0, 0) |
| (D2L; L) | (0, 0) | (1, 0) |
| (L2D; L) | (1, 0) | (0, 0) |
| (L2D; D) | (0, 0) | (1, 0) |
| (C2L; C) | (1, 3) | (0, 0) |
| (C2L; L) | (0, 0) | (1, 0) |

Given the definition elements defining the metatasks, the types of metatasks can be derived using function mtype: $\mathcal{T}_3 \rightarrow \{\text{'process'}, \text{'transport'}\}$ defined as follows:

| mtype(t)= | | |
|---|---|---|
| 'process' | if | $|I_3(t)|=1$ $\wedge (\exists c : c \in I_3(t)$ $: Cb_3(t,c).0 = 1 \wedge Ce_3(t,c).0 = 1$ $\wedge Cb_3(t,c).1 < Ce_3(t,c).1$ ) |
| 'transport' | if | $|I_3(t)|=2$ $\wedge (\exists c,c',n : c,c' \in I_3(t), n \in \mathbb{N}$ $: Cb_3(t,c).0 = n \wedge Cb_3(t,c').0 = 0$ $\wedge Ce_3(t,c).0 = 0 \wedge Ce_3(t,c').0 = n$ ) |

Note that for this restricted case with only two types of metatasks the type identification could be a function returning a Boolean value. The metatask definition elements outline the manufacturing possibilities of the system, together with the systems dependent elements.

Although the number of possible exceptional states of a complex manufacturing machine is very large, the number of metatasks is limited: 14 in this embodiment. This section explains how this compact TRS definition level 3 can be used to instantiate a recovery, once an exception is encountered. The instantiation transformation is split in two operations: a search operation and a conversion operation. A search algorithm searches for traces of instantiated metatasks that bridge the gap between a given (exceptional) system state and a certain desired target system state. The conversion converts such a trace into an instantiated unselected TRS definition of the recovery. After instantiation of the recovery definition it can be merged with the remainder of the original definition. After scheduling of the resulting definition, manufacturing can be resumed.

The search algorithm generates a search graph, starting from the exceptional system state and aiming to find a recovered target state. The nodes of the graph can be associated with system states, and the edges with instantiated metatasks or tasks. An instantiated metatask can be characterized by the metatask and the involved material instances. A trace in the search graph can be characterized by a sequence of instantiated metatasks: $(\mathcal{T}_3 \times \mathcal{P}(\mathcal{M}))^*$.

Let function $Cm:C \to \mathbb{N}$ be a function that determines the number of material instances that can reside on all resources of a certain capability together.

$$Cm(c) = \sum_{r \in A(c)} Rm(r) \qquad (2)$$

Let function $E:(C \to \mathcal{P}(\mathcal{M} \times S_m)) \to \mathcal{P}(\mathcal{T}_3 \times \mathcal{P}(\mathcal{M}))$ be a function that determines which tasks including the involved material instances are eligible to be instantiated in a certain system state:

$$E(Ssys) = \qquad (3)$$
$$[(t, mr) \mid t \in \mathcal{T}_3, mr \subseteq \mathcal{M}$$
$$, mtype(t) =' process' \Rightarrow (\exists c, m, s_m : c \in I_3(t), m \in mr, (m, s_m) \in Ssys(c)$$
$$: s_m \geq Cb_3(t, c).1$$
$$)$$
$$, mtype(t) ='$$
$$transport' \Rightarrow (\exists c, c' : c, c' \in I_3(t), Cb_3(t, c).0 = |mr|, Ce_3(t, c').0 = |mr|$$
$$, mr \subseteq \{ms.0 \mid ms \in Ssys(c)\}$$
$$: |Ssys(c')| \leq Cm(c') - |mr|$$
$$)$$
$$\}$$

Process type tasks are eligible to be instantiated if there is a material instance at the involved capability that is at least the required manufacturing phase. Transport-type tasks are eligible to be instantiated if there is enough material available at the 'from' capability c and enough room at the 'to' capability c'.

Let function
updatestate:$(C \to \mathcal{P}(\mathcal{M} \times S_m)) \times (\mathcal{T}_3 \times (\mathcal{P})\mathcal{M})) \to (C \to \mathcal{P}(\mathcal{M} \times S_m))$
be a function that updates the system state given an instantiated metatask defined by updatestate:(Ssys,(t,mr))=Ssys' such that:

$$(mtype(t) =' process' \Rightarrow (\forall c, m, s_m \qquad (4)$$
$$: c \in I_3(t), m \in mr, (m, s_m) \in Ssys(c)$$
$$: (m, s_m) \notin Ssys'(c) \wedge (m, Ce_3(t, c).1) \in Ssys'(c)$$
$$)$$
$$)$$
$$\wedge (mtype(t) =' transport' \Rightarrow (\forall c, c', msr$$
$$: c, c' \in I_3(t), Cb_3(t, c).0 = |mr|, Ce_3(t, c').0 = |mr|$$
$$, msr = \{ms \mid ms \in Ssys(c), ms.0 \in mr\}$$
$$: msr \not\subseteq Ssys'(c)$$
$$\wedge (\forall ms : ms \in msr$$
$$: (ms.1 = Cb_3(t, c).1 \Rightarrow ms \in Ssys'(c'))$$
$$\wedge (ms.1 < Cb_3(t, c).1 \Rightarrow (ms.0, Ce_3(t, c').1) \in Ssys'(c'))$$
$$)$$
$$)$$
$$)$$

In case of a process metatask, the manufacturing phase of the involved material is updated. In case of a transport metatask, the material involved is removed from the 'from' capability (c) and added to the 'to' capability (c'). The manufacturing phase of the involved material remains unchanged if the actual manufacturing phase was equal to the begin manufacturing phase (pre-condition), and is reset to the end manufacturing phase (post-condition) if not.

The search algorithm should fulfill some requirements to fit in a supervisory machine control system. Without an ad-hoc search algorithm, an exception for which no recovery is predefined would imply an operator intervention. The machine's down time including manual recovery typically takes a few hours. Substrate processing cycle time is two orders of magnitude less, as can be concluded from FIG. 14. Automatic recovery by a supervisory machine control system is likely to take an amount of time which is of the same order. From this, it can be concluded that finding a recovery is most important, rather than finding a time-optimal (fastest) recovery. However, in general it is also possible that an exception cannot be recovered automatically as some essential metatasks are simply not under control of the supervisory machine control system.

Figure 15:
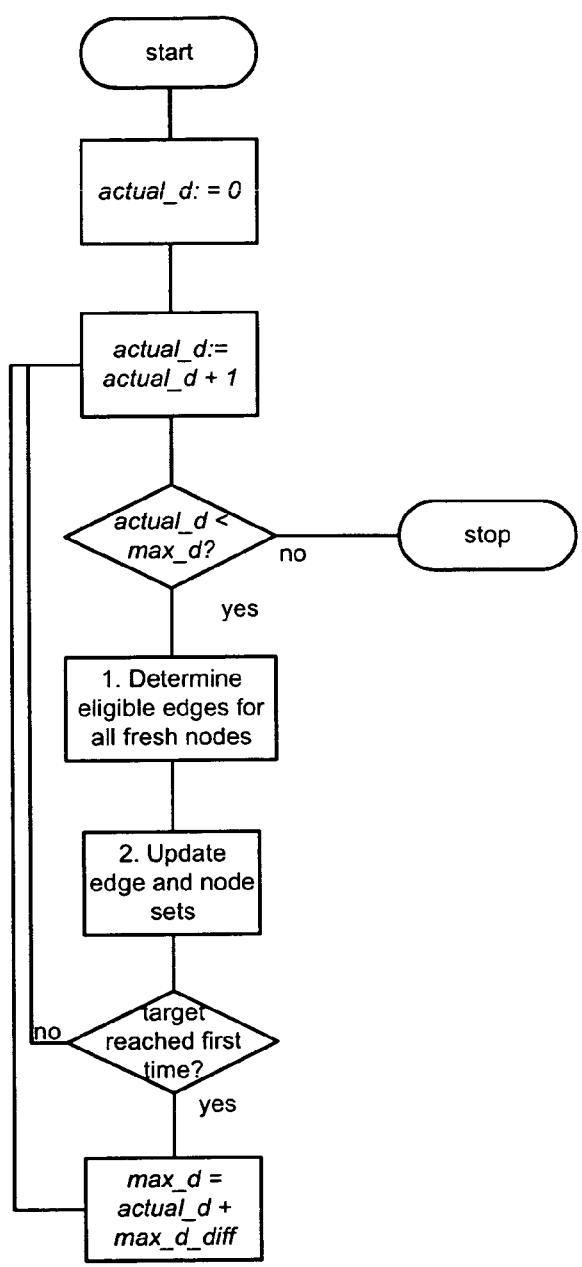
FIG. 15 shows a search algorithm.

A breadth-first search algorithm is applied, with a maximum search depth (max_d) to avoid wasting time by fruitless searching. By default, searching stops when the target state is reached for the first time. The time needed for recovery is expected to be reasonable, as the path consists of a minimum number of tasks. To analyze recovery time optimization possibilities, it is possible to extend the default search procedure to allow longer recovery traces than the one found first. The number of additional tasks is parameterized by variable (max_d_diff). In FIG. 15 the search algorithm is shown. In act 1, all eligible tasks are determined using function E. In act 2, the datasets describing the nodes (states) and edges (instantiated metatasks) are updated using function updatestate. For each node, the search depth at first visit is recorded. Some pruning rules are applied to reduce search graph growth:

- New edges are added only if the state reached is new or if the actual search depth minus the depth at first visit of the reached state does not exceed the maximum depth difference (max_d_diff).
- Edges that result in non FIFO machine behavior are not added.
- Edges that close two-node cycles (from state b to a after an edge from state a to b) are not added.
- If necessary, more pruning rules can be added.

If the target state is reached the first time, the maximal search depth is revised such that searching stops after max_d_diff more iterations.

With a successful recovery trace tr from the search graph, a definition of level 2 can be generated. Function convert: $(\mathcal{T}_3 \times \mathcal{P}(\mathcal{M}) \times \mathcal{T}_2)^* \times (\mathcal{T}_3 \times \mathcal{P}(\mathcal{M}))^* \to \mathcal{D}_2$ is a function that performs this conversion.

Above $D_2^\epsilon$ denotes the empty system definition, $\epsilon$ denotes the empty trace and $(t_2, D'_2)$=addtask(maptr,hd(tr)). To convert a found recovery trace tr into a recovery system definition $D_2^{rec}$, the convert function is called with ($\epsilon$, tr) as argument. The internal variable maptr is used to record the mapping of the instantiated metatasks to tasks and to determine the task precedence relation.

Function addtask: $(\mathcal{T}_3 \times \mathcal{P}(\mathcal{M}) \times \mathcal{T}_2)^* \times (\mathcal{T}_3 \times \mathcal{P}(\mathcal{M})) \to (\mathcal{T}_2 \times \mathcal{D}_2)$ is a function that instantiates for an instantiated metatask $t_3$ a task $t_2$ including its involved material mr to form an extension for the system definition of level 2, given a map trace maptr defined by addtask:(maptr, $(t_3, mr)$)=$(t_2, D'_2)$ such that:

$$t_2 \in \mathcal{T}'_2 \wedge t_2 \notin \mathcal{T}_2 \tag{6}$$

$$\wedge (\forall c : c \in I_3(t_3) : c \in I'_2(t_2))$$

$$\wedge (\forall c : c \in I_3(t_3), Cb_3(t_3, c).0 \neq 0 : Cb'_2(t_2, c) = mr)$$

$$\wedge (\forall c : c \in I_3(t_3), Ce_3(t_3, c).0 \neq 0 : Ce'_2(t_2, c) = mr)$$

$$\wedge (\forall m, mtr : m \in mr, mtr = filterctr(maptr, c)$$

$$: (hr(mtr).2, t_2) \in P'_2$$

$$)$$

$$\wedge (\forall c, ctr : c \in I_3(t_3), ctr = filterctr(maptr.c)$$

$$: capprec(ctr, c, t_2, mr) \subseteq P'_2$$

$$)$$

Above, function filtercr:$(\mathcal{T}_3 \times \mathcal{P}(\mathcal{M}) \times \mathcal{T}_2)^* \times C \to (\mathcal{T}_3 \times \mathcal{P}(\mathcal{M}) \times \mathcal{T}_2)^*$ filters the tasks involving some capability c from a trace maptr, and is defined as follows:

$$convert(maptr, tr) = \begin{cases} D_2^\epsilon & \text{if } tr = \varepsilon \\ convert(maptr\text{++}[hd(tr).0, hd(tr).1, t_2], tl(tr)) \cup D'_2 & \text{if } tr \neq \varepsilon \end{cases} \tag{5}$$

$$filterctr(maptr, c) = \begin{cases} \varepsilon & \text{if } maptr = \varepsilon \\ filterctr(tl(maptr), c) & \text{if } maptr \neq \varepsilon \wedge c \notin I_3(hd(maptr).0) \\ [hd(maptr)] ++ filterctr(tl(maptr), m) & \text{if } maptr \neq \varepsilon \wedge c \in I_3(hd(maptr).0) \end{cases} \quad (7)$$

Additionally, function filtermtr:$(\mathcal{T}_3 \times \mathcal{P}(\mathcal{M}) \times \mathcal{T}_2)^* \times \mathcal{M} \to (\mathcal{T}_3 \times \mathcal{P}(\mathcal{M}) \times \mathcal{T}_2)^*$ filters the tasks involving some material m from a trace maptr, and is defined as follows:

$$filtermtr(maptr, m) = \begin{cases} \varepsilon & \text{if } maptr = \varepsilon \\ filtermtr(tl(maptr), m) & \text{if } maptr \neq \varepsilon \wedge m \notin (hd(maptr).1 \\ [hd(maptr)] ++ filtermtr(tl(maptr), m) & \text{if } maptr \neq \varepsilon \wedge m \in (hd(maptr).1 \end{cases} \quad (8)$$

Function addtask adds an additional task $t_2$ to the existing definition $D_2$, and assigns to this task the involved capabilities and the material instances to its begin and end material configuration. Furthermore, a precedence edge is instantiated from the rear task of the material lives of the involved material instances to the new task. Finally, precedence edges can be instantiated from the task involving the same capabilities. This is done using function capprec:$(\mathcal{T}_3 \times \mathcal{P}(\mathcal{M}) \times \mathcal{T}_2)^* \times C \times \mathcal{T}_2 \times \mathcal{P}(\mathcal{M}) \to \mathcal{P}(\mathcal{D}_2)$, which is defined as follows:

$$capprec(ctr, c, t_2, mr) = \begin{cases} \emptyset & \text{if } ctr = \varepsilon \\ \{(hr(ctr).2, t_2)\} & \text{if } ctr \neq \varepsilon \wedge |mr \cup hr(ctr).1| > Cm(c) \\ capprec(tr(ctr), c, t_2, mr \cup hr(ctr).1 & \text{if } ctr \neq \varepsilon \wedge |mr \cup hr(ctr).1| \leq Cm(c) \end{cases} \quad (9)$$

If the material capacity of an involved capability is equal to the involved number of materials, a precedence edge from the latest task in the trace for that capability involving another material is instantiated. For instance: a task involving the load robot capability will be linked to the latest task in the map trace that also involves the load robot and another material. If there is more room for material, as many material instances are skipped as there is room for. For instance: a task involving the wafer stage capability and material W3 will not be linked to tasks involving another material W2, but will be linked to the latest task involving the wafer stage and yet another material W1. Note that some redundant precedence edges result from capprec, but they are not disadvantageous.

If recovery brings the system in the same state as was expected without the exception, the remainder of the original scheduling problem can be resumed after recovery. Function merge merges the recovery TRS definition $D_2^{rec}$ and the remainder of the initial TRS definition $D_2^{ini}$ by linking the sub-lives of the involved material instances: merge($D_2^{rec}$, $D_2^{ini}$)=$D_2$' such that $D_2'=D_2^{rec} \cup D_2^{ini}$ where $D_2^{rec} \cup D_2^{ini}$ is a pairwise union of all set definition elements except that the material sub-lives are connected:

$$(\forall m, t, t' : m \in M_2^{rec}, t \in T_2^{rec}, t' \in T_2^{ini} \quad (10)$$
$$, (\nexists t'' : t'' \in T_2^{rec} : (t, t'') \in P_{2m}(D_2^{rec}, m))$$
$$, (\nexists t'' : t'' \in T_2^{ini} : (t'', t') \in P_{2m}(D_2^{ini}, m))$$
$$: (t, t') \in P_2')$$

Here, it is assumed that the nodes in the two system definitions do not intersect: $N_2^{rec} \cap N_2^{ini} = \emptyset$. This might imply renaming of nodes in the recovery. Furthermore, $P_{2m}$ is a function describing for a material $m \in \mathcal{M}_2$ in a TRS definition $D_2^e \in \mathcal{D}_2$, a precedence relation between related nodes without redundant edges:

$$P_{2m}(D_2^e, m) = \{(t, t') \quad (11)$$
$$|(t, t') \in P_2^e$$
$$\wedge \{cm.0|cm \in Ce_2(t), m \in cm.1\}$$
$$= \{cm.0 \mid cm \in Cb_2(t'), m \in cm.1\}$$
$$\wedge \neg \text{redundant}(t, t', P_2^e)\}$$

where function $\mathcal{T}_2 \times \mathcal{T}_2 \times P_2 \to \mathbb{B}$ determines whether a precedence edge (t, t') is redundant in a precedence relation P:

$$\text{redundant}(t,t',P) = (\exists t'': t'' \in \mathcal{T}_2, t'' \neq t', t'' \neq t : \text{path}(t,t'',P)$$
$$\wedge \text{path}(t'',t',P)) \quad (12)$$

Function path: $N_2 \times N_2 \times P_2 \to \mathbb{N}$ used above determines whether there is a path between two tasks t and t' in a precedence relation P:

$$\text{path}(t, t', P) = \begin{cases} \text{true} & \text{if } t = t' \\ (\exists t'' : (t, t'') \in P : \text{path}(t'', t', P)) & \text{if } t \neq t' \end{cases} \quad (13)$$

Figure 16:
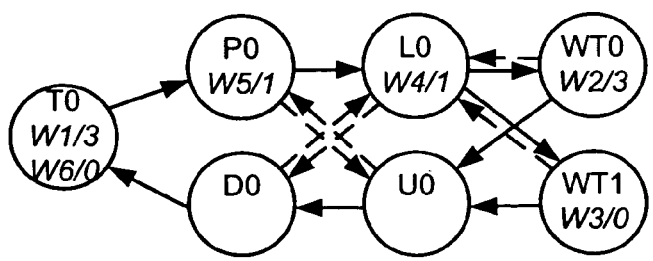
FIG. 16 depicts a situation in the machine.

To illustrate the approach, an example exception in the substrate scanner is considered: the measure task of substrate W3 fails, which is raised at the end of the task at t=91. After completion of the tasks in progress (pre-alignment of W5), at t=94 [s], the situation in the machine is as depicted in FIG. 16. The exception has caused substrate W3 to stick to manufacturing phase 1 ('pre-aligned') rather than manufacturing phase 2 ('measured'). A trivial recovery would be to retry the measure task of the substrate. However, for this substrate it is assumed that retrying measuring is not useful without retrying pre-aligning. Therefore, the manufacturing phase of substrate W3 is set to 0 ('fresh'). The exceptional system state can be constructed from FIG. 16 in a straightforward way. The target system state differs from this state only for substrate W3: it should be in phase 2 ('measured').

Figure 17:
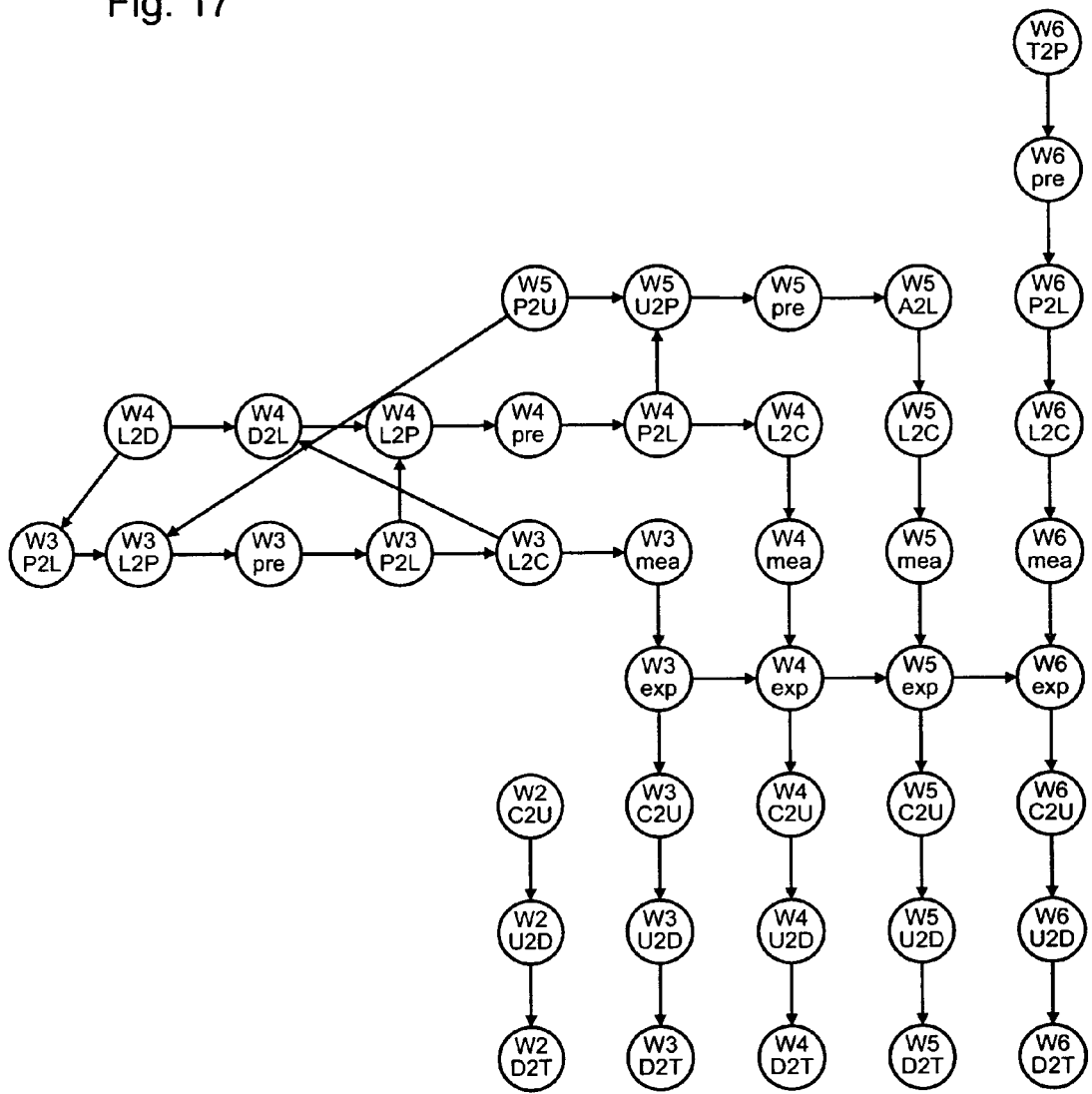
FIG. 17 shows a task precedence graph.
Figure 18:
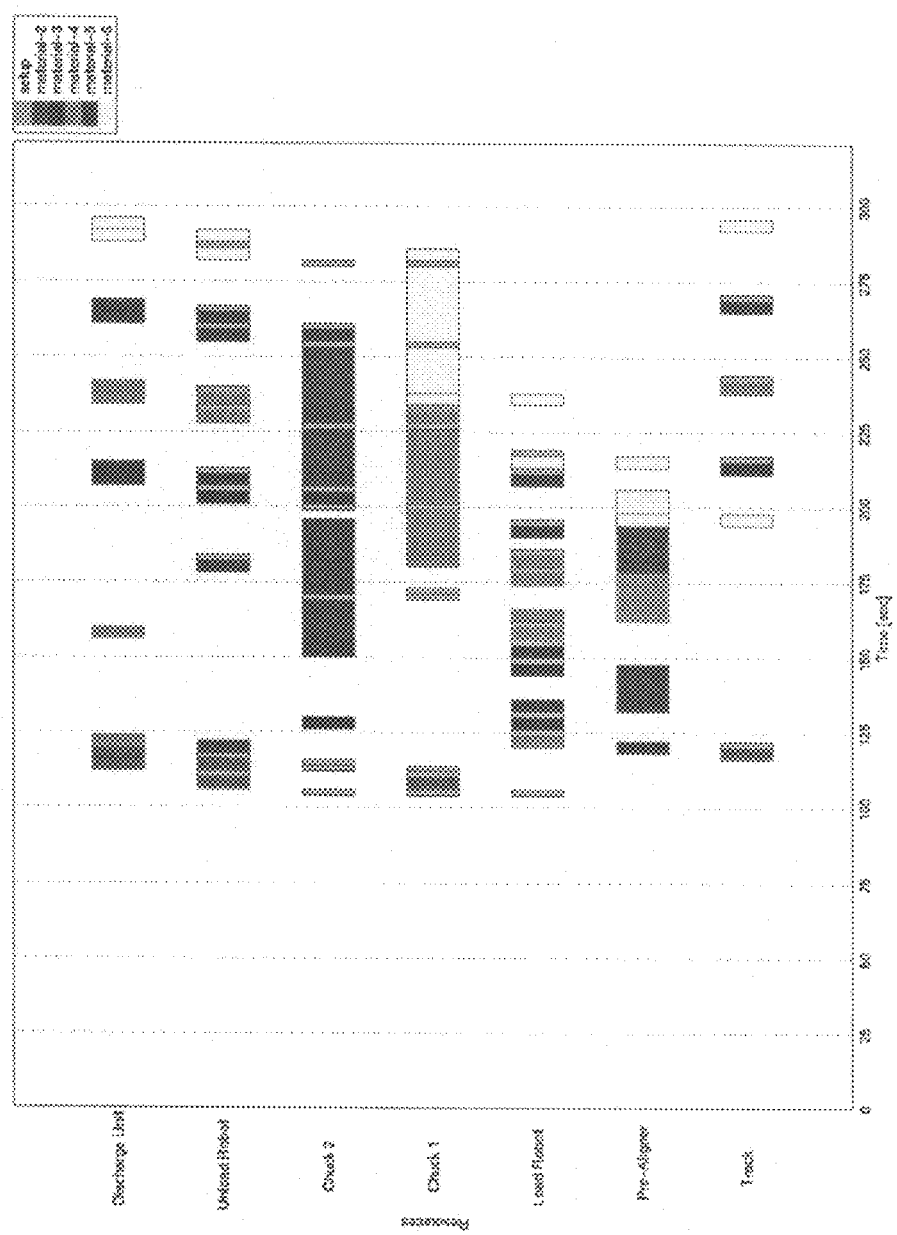
FIG. 18 shows a schedule.

First, the search algorithm is used to find a recovery without allowing longer traces: max_d_diff=0. This results in a recovery trace consisting of 14 tasks. After conversion and merging the recovery with the remainder of the tasks to be done, the task precedence graph of FIG. 17 results. In this precedence graph, the recovery tasks per substrate are depicted horizontally, whereas the remainder of the original graph is unchanged: the remaining tasks per substrate are depicted vertically. This recovery can be characterized as a 'rewind' recovery: substrates W4 and W5 are parked at the Discharge unit and the Unload robot, respectively, to clear the path for substrate W3 to be transported back to the Pre-aligner. Assuming that recovery search and scheduling (Supervisory Machine Control (SMC) reaction) take 10 seconds, the schedule in FIG. 18 can be obtained. This schedule finishes at t=296 [s], which is 81 seconds later than the original schedule. From this, the recovery itself took 68 seconds, as 13 seconds were needed for waiting till the machine was idle (3 [s]) and SMC reaction (10 [s]). It appears that recovery indeed takes an amount of time that is in the same order as substrate processing cycle time.

Figure 19:
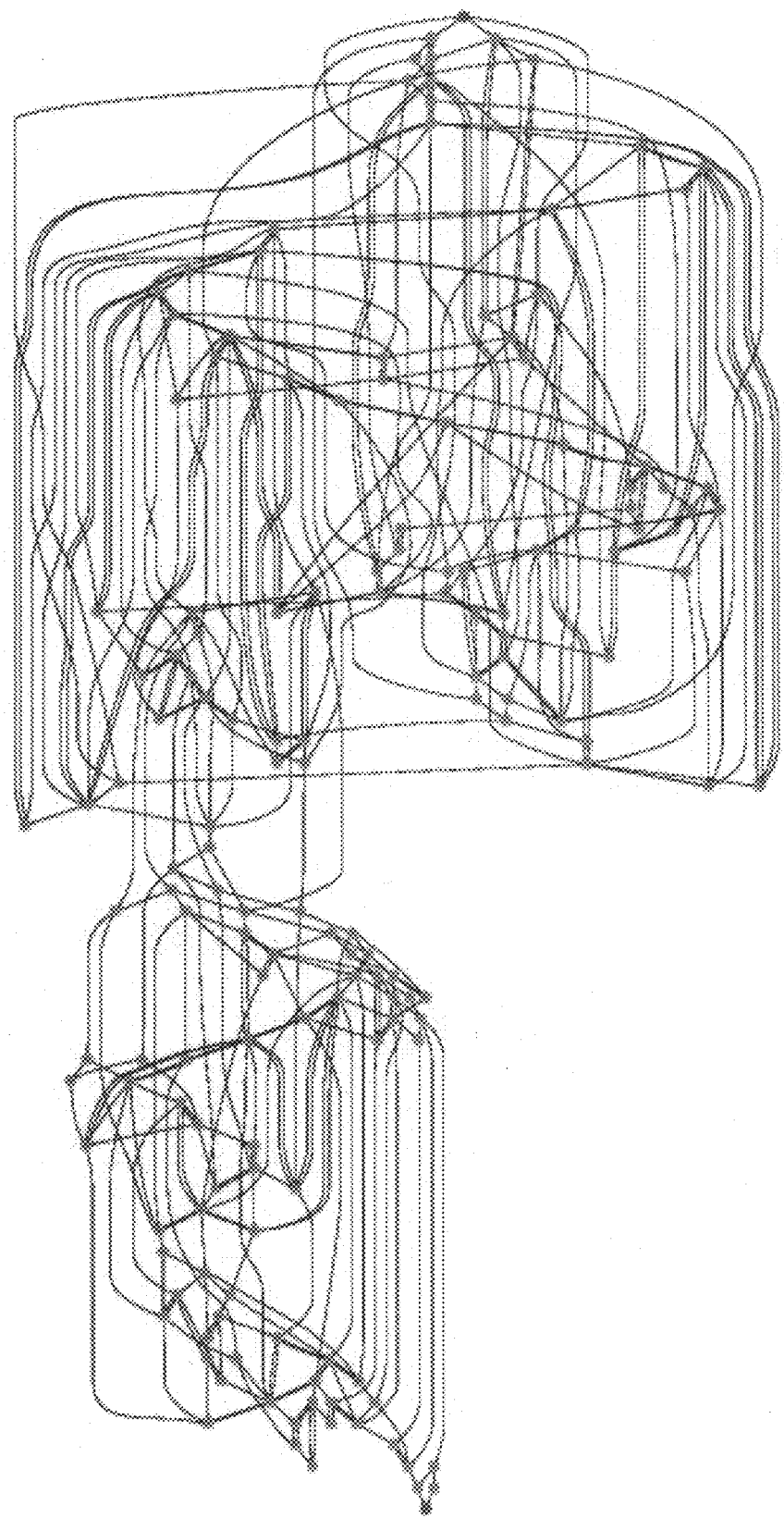
FIG. 19 depicts a search graph.
Figure 20:
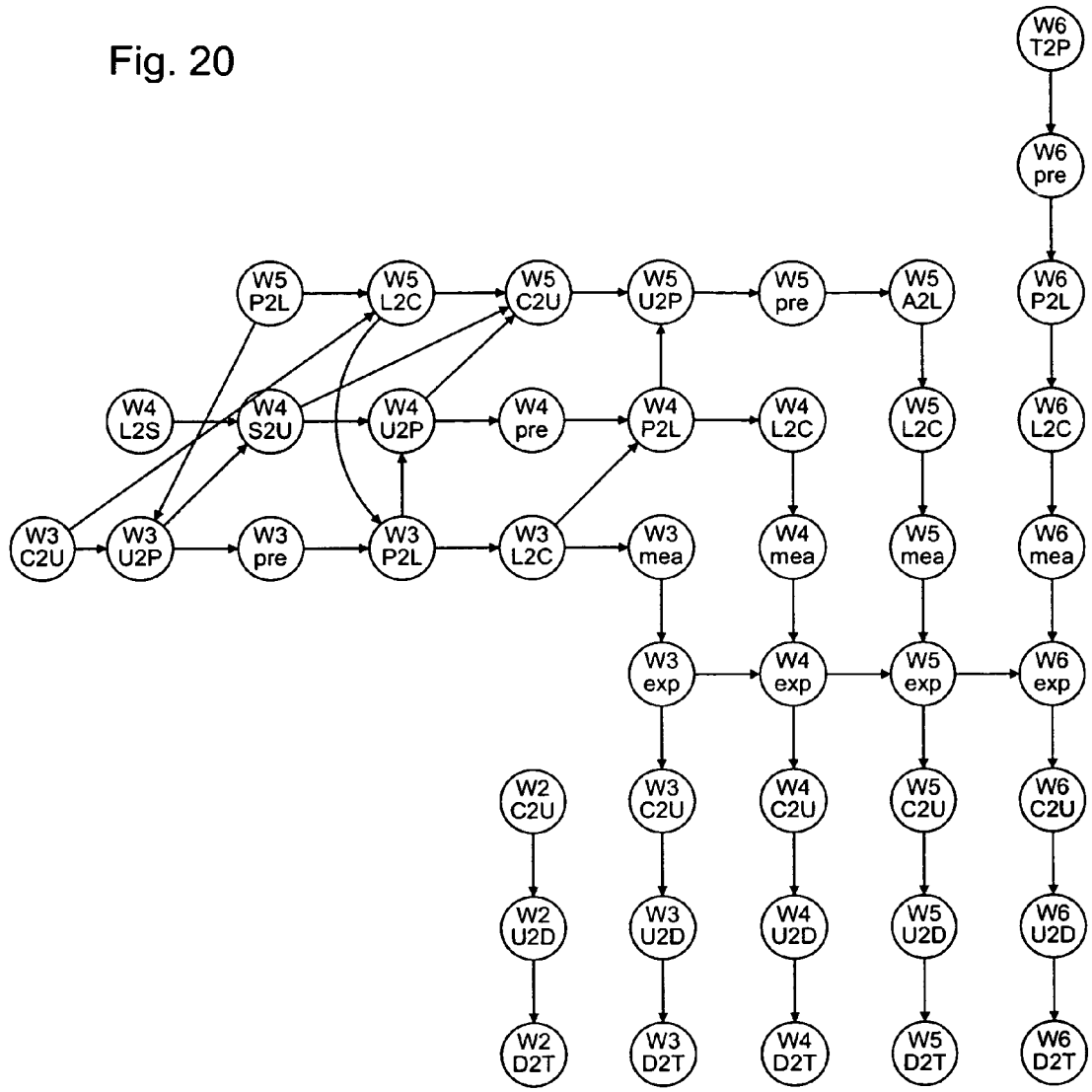
FIG. 20 depicts a precedence graph for a recovery and a remainder of the original graph.
Figure 21:
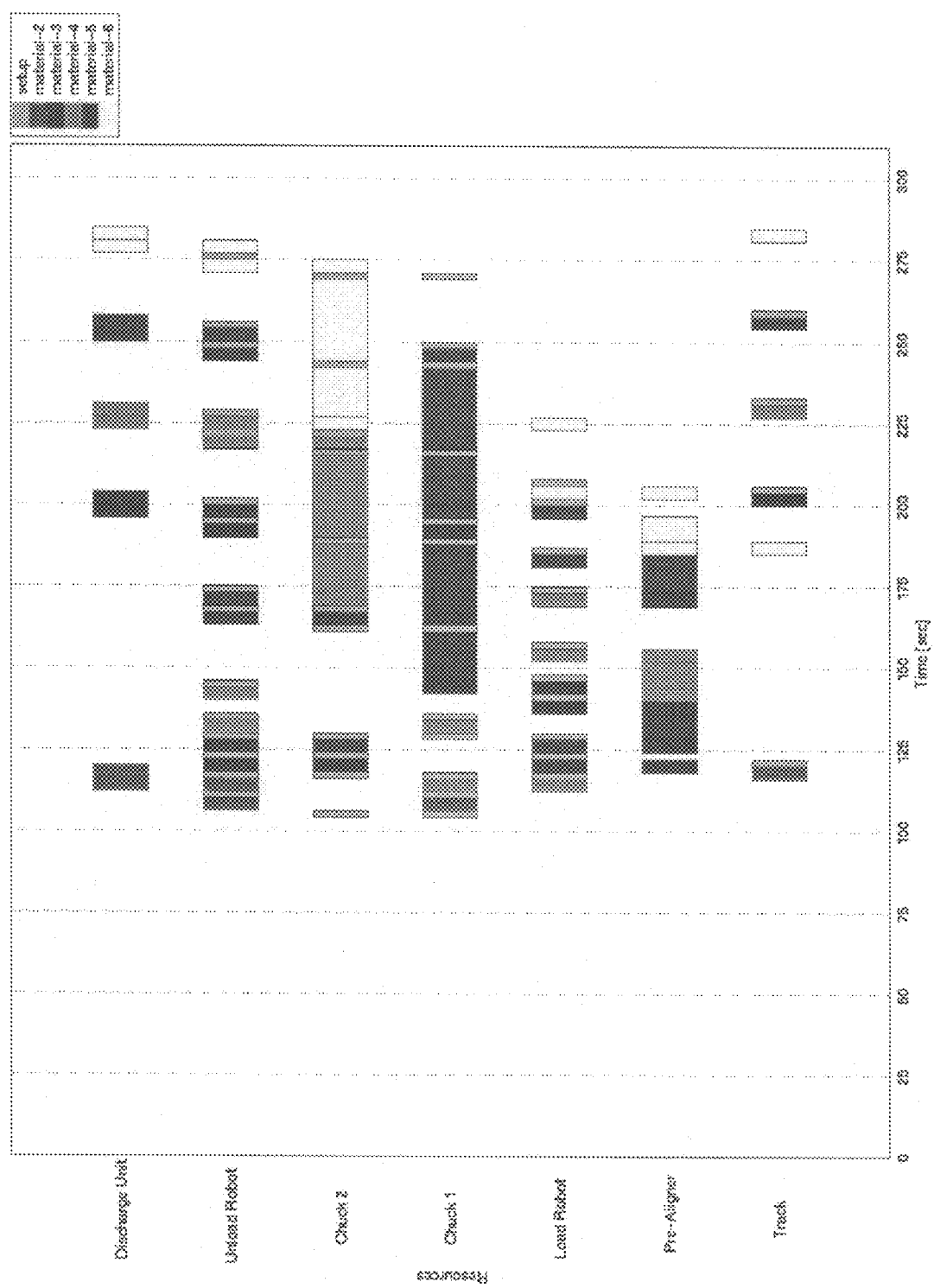
FIG. 21 depicts a schedule of the cycle recovery.

Subsequently, optimization possibilities are analyzed. The search algorithm is restarted with max d=14 and max_d_diff=2, to allow for traces up to 16 tasks. After cutting off unsuccessful traces, the search graph as depicted in FIG. 19 results. This search graph also contains a trace consisting of 16 tasks that can be characterized as a 'cycle' recovery. The precedence graph for this recovery and the remainder of the original graph is depicted in FIG. 20. Substrate W3, as well as substrates W4 and W5 follow an additional cycle through the machine to reach the pre-aligner again via the unload robot. A schedule of the cycle recovery is depicted in FIG. 21, assuming that SMC reaction still takes 10 seconds. Although this recovery uses more tasks, it is faster as more parallelism can be exploited. The end time of this schedule is 285 [s], which means that the delay caused by recovery is 14% less than the 'rewind' recovery. This is an over-approximation as in reality SMC reaction is slowed down by the more extensive search, which could even cost more than optimization brings.

Figure 22:
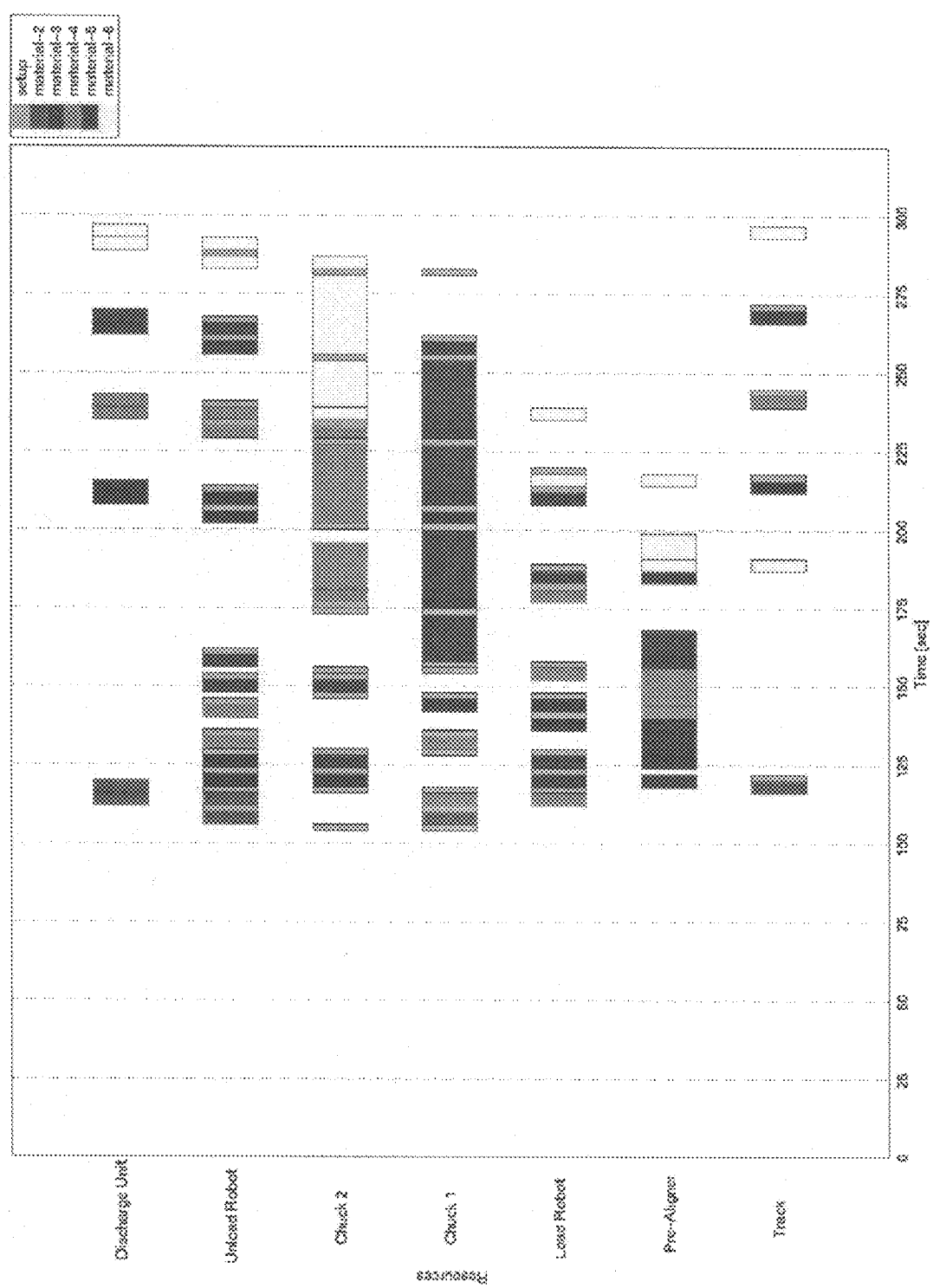
FIG. 22 shows another schedule for the cycle recovery.

To show that multiple schedules are possible for one recovery, FIG. 22 is added, that shows another schedule for the 'cycle' recovery. This schedule ends at t=297 [s], which is even later than the schedule for the 'rewind' recovery found first. In this case, substrate W5 is transported from its substrate table to the unload robot before substrate W3 is transported from the load robot onto a substrate table, which was done the other way around in FIG. 21.

Whilst the huge number of exceptional states that a complex manufacturing machine can get in makes it practically impossible to predefine recoveries for each exception. At least some embodiments of the present invention provide an approach to overcome this problem by ad-hoc run time recovery search once a specific exception occurs. The manufacturing possibilities can be defined intuitively within the TRS framework, in the form of an uninstantiated TRS definition. A search algorithm bridges the gap between the exceptional state and a target state, thus instantiating a recovery. Results from an example show that the algorithm is suited for practical use as the first recovery is found in reasonable time, and recovery speed optimization is less important. The recoveries found by the algorithm can be stored in a database by the supervisory control system to let it learn how to recover from exceptions.

Instead of the pragmatic maximum search depth to avoid fruitless searching, another embodiment of the present invention might do a reachability analysis. Furthermore, the present invention can also be applied, in addition to transport and process metatasks, to initialization or calibration metatasks.

A further embodiment of the invention is applied to calibration of the apparatus, and in particular to the alignment of a substrate to the aerial image of a mask after substrate table exchange in a dual stage apparatus.

Figure 23:
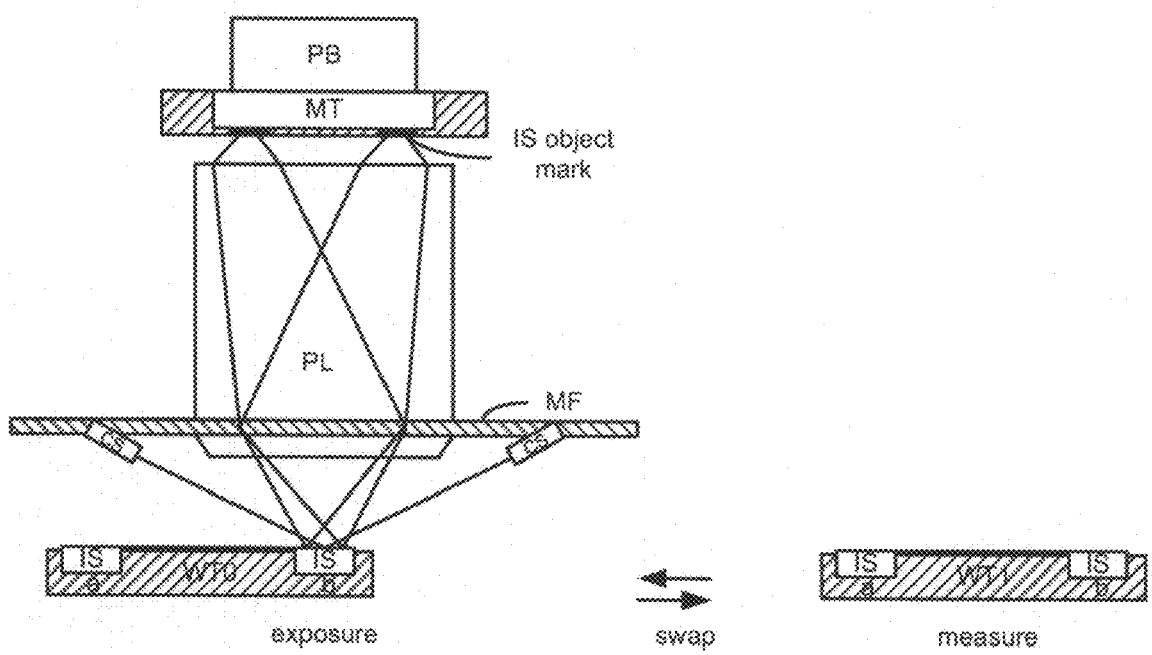
FIG. 23 shows two types of measurements that can be applied in a calibration sequence.

In this calibration sequence two types of measurements can be applied as is shown in FIG. 23. A Confidence Sensor measurement (CS) determines the height of a point on the surface of a substrate or substrate table (W or W1). In an Image Sensor (IS) measurement, IS object marks on the mask table (MT) are projected through the lens. Image sensors mounted on the substrate table measure the aerial position of the projected object marks. Sensors can operate in different modes that are characterized by their specific capture range and inaccuracy. However, the different types of measurements involve different parameters. Each type of measurement is characterized by its own kinematic chain, as depicted in FIGS. 24A and B.

Figure 24A:
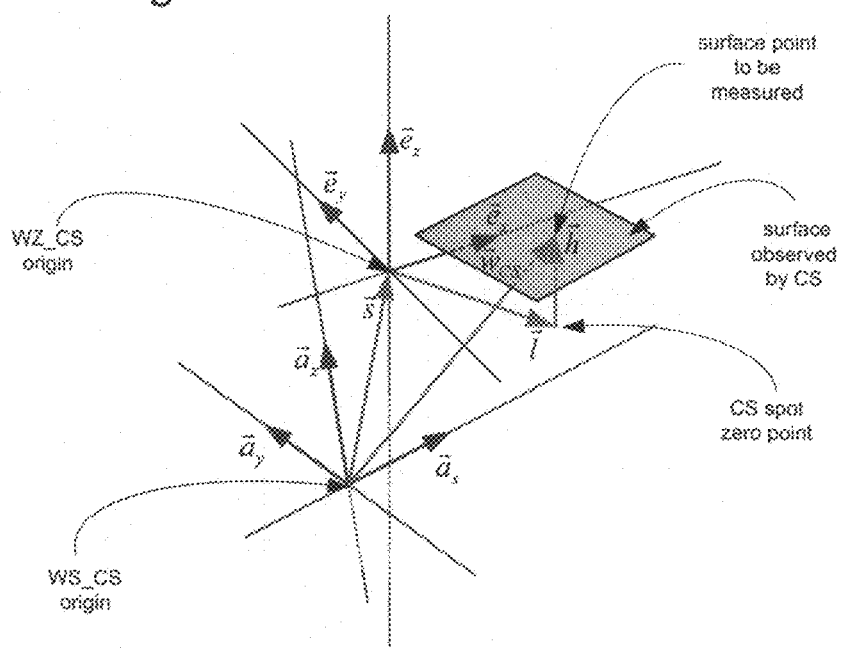
FIG. 24A shows a kinematic chain for a confidence sensor measurement.

FIG. 24A shows the kinematic chain for a CS measurement involving:

Substrate table coordinate system (WT_CS) with base $\alpha = (\vec{\alpha}_x, \vec{\alpha}_y, \vec{\alpha}_z)$.

Metro Frame coordinate system or wafer stage zeroing coordinate system (WZ_CS) with base $\epsilon = (\vec{e}_x, \vec{e}_y, \vec{e}_z)$.

CS spot zero point.

Surface point to be measured.

The following vectors can be identified in FIG. 24A:

$\vec{h}$: vector from the CS spot zero point to the surface to be measured.

$\vec{l}$: vector from the WZ_CS origin to the CS spot zero point.

$\vec{s}$: vector from the WT_CS origin to the WZ_CS origin $\vec{w}_{cs}$: vector from the WT_CS origin to the surface point to be measured.

The following vector relation representing the kinematic chain for a CS measurement can be described:

$$\vec{s} + \vec{l} + \vec{h} = \vec{w}_{cs}. \quad (14)$$

Figure 24B:
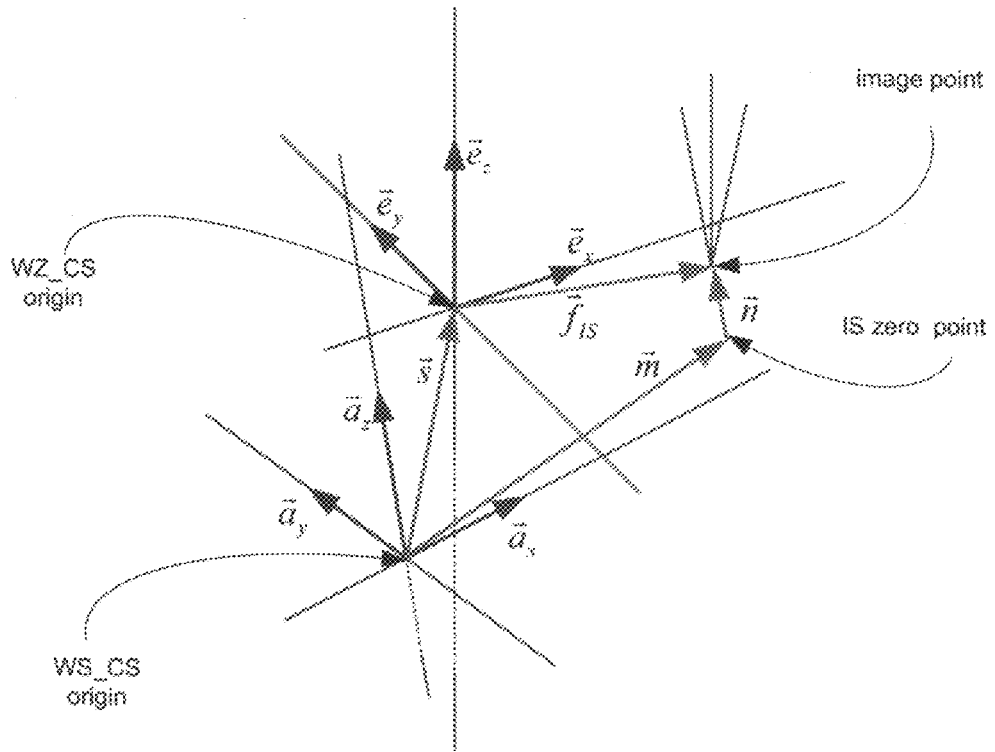
FIG. 24B shows a kinematic chain for an image sensor measurement.

FIG. 24B shows the kinematic chain for an image sensor measurement involving:

WT_CS and WZ_CS as in the CS kinematic chain.
Image sensor (IS) zero point.
Image point.
And the following vectors in FIG. 3(b):

$\vec{s}$.: as in the CS kinematic chain $\vec{n}$: vector from the IS zero point to the image point.

$\vec{f}_{is}$: vector from the WZ_CS origin to the image point.

$\vec{m}$: vector from the WT_CS origin to the IS zero point.

When the substrate table is in the aligned position, the IS zero point and the image point are at the same position. In that case, $\vec{n}$ reduces to zero and $\vec{s}$ is the aligned position vector. From FIG. 24B the following vector relation representing the kinematic chain for an IS measurement can be derived:

$$\vec{f}_{is} + \vec{s} = \vec{m}. \quad (15)$$

To bridge the gap between the initial inaccuracy in the order of micrometers and desired accuracy in the order of nanometers, the results of both types of measurements must be combined. In between the different types of measurement, the geometric relation between the different parameters must be used for conversion.

The scheduling model of a complex machine with its physical restrictions is defined above. For the purposes of this embodiment, the elements needed for the timing transformation, as well as material logistics are not relevant. Without them, the scheduling model can be defined by a 6-tuple $(\mathcal{T}_2, P_2, \mathcal{R}, C, A, I_2)$:

$\mathcal{T}_2$ is a finite set of elements called tasks, e.g., an exposure.

$P_2 \subseteq \mathcal{T}_2 \times \mathcal{T}_2$ is the precedence relation between tasks, e.g. an alignments task precedes an exposure task.

C is a finite set of elements called capabilities, e.g. substrate table WT.

$\mathcal{R}$ is a finite set of elements called resources, e.g. substrate table WT0, WT1.

$A: C \rightarrow \mathcal{P}(\mathcal{R})$ gives the set of resources that are available for a certain capability, e.g. resources WT and WT1 for capability WT.

$I_2: \mathcal{T}_2 \rightarrow \mathcal{P}(C)$ gives the set of capabilities that are involved in a certain task, e.g., an exposure task involves substrate table WT and mask table MT.

The parameters involved in the alignment process can be related using a linear equation. The equations for different types of measurements can be defined using matrices:

$$Ax = b. \quad (16)$$

Here, b contains known constants, x contains parameters and A contains coefficients. Each type of measurement can be done at a limited number of measurement positions and sensor units. For different measurement positions and sensor units, different equations are applicable. If we instantiate (16) for these, we get $$A_p x_p = b_p \quad (17)$$

EXAMPLE 1

Plane Positioning

Figure 25:
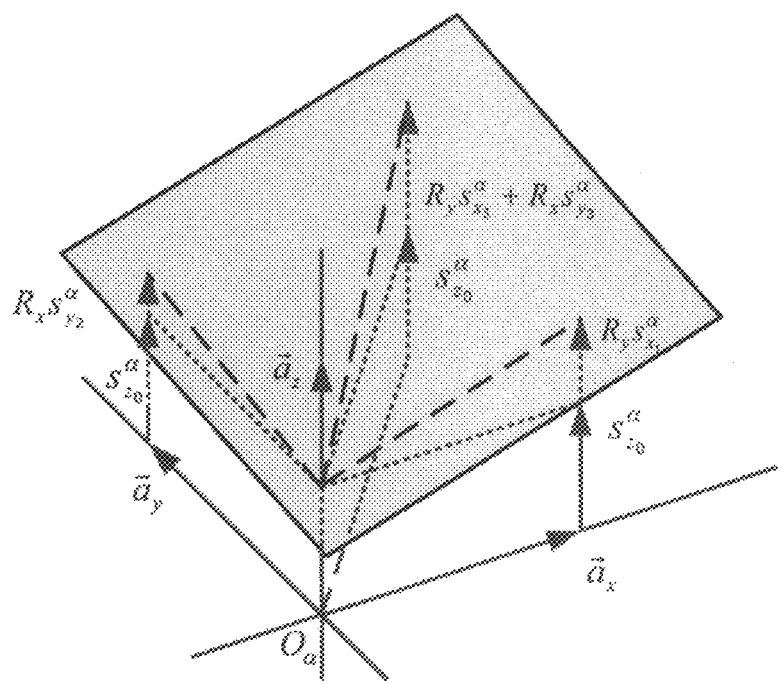
FIG. 25 shows a measurement of positions in a plane.

We consider a plane nearly parallel to the XY plane of a coordinate system with base $\alpha = (\vec{\alpha}_x, \vec{\alpha}_y, \vec{\alpha}_z)$ and origin $O_\alpha$ (see FIG. 25). A sensor is available to measure the height (z) of points on the plane. We derive the following linear relation of the parameters involved in the height measurement:

$$s_{z_p}^\alpha = s_{z_o}^\alpha + R_y s_{x_p}^\alpha + R_x s_{y_p}^\alpha \quad (18)$$

We can rewrite this in the form of (16) as follows:

$$s_{z_0}^\alpha + R_y s_{x_p}^\alpha + R_x s_{y_p}^\alpha - s_{z_p}^\alpha = 0 \quad (19)$$

Suppose that the sensor can measure at three different positions in the XY-plane: $(s_{z_p}^\alpha, s_{y_p}^\alpha) = (1,0), (0,1)$, and $(1,1)$ (see FIG. 25). Instantiating the three positions in (19) yields:

$$\begin{bmatrix} 1 & 1 & 0 & -1 & 0 & 0 \\ 1 & 0 & 1 & 0 & -1 & 0 \\ 1 & 1 & 1 & 0 & 0 & -1 \end{bmatrix} \begin{bmatrix} s_{z_0}^\alpha \\ R_y \\ R_x \\ s_{z_1}^\alpha \\ s_{z_2}^\alpha \\ s_{z_3}^\alpha \end{bmatrix} = 0 \quad (20)$$

Using m equations from a linear system such as equation (17) it is possible to derive r unknown parameters. Here r denotes the rank of the coefficient matrix for the m equations, i.e. the number of linearly independent parameters. If more than r parameters are unknown, a solution can be to combine unknown parameters into combined parameters. A combined parameter can be defined as some linear combination of the original parameters. Substitution of such combined parameters in the m equations may result in a solvable system. The solution encompasses some original parameters and the combined parameters, thus localizing the solution freedom in the combined parameters. Using this result it might be possible to execute a subsequent calibration task if the combined parameters are not needed as an input, or if the combined parameters suffice as input. The equations defining the combined parameters in terms of the original parameters can be of use to determine the original parameters later on. Therefore, we add the combined parameters and the equations defining them to equation (17), together with the equations resulting from substitutions, yielding:

$$A_{pc} X_{pc} = b_{pc} \quad (21)$$

Note that numerous combined parameters and substitutions can be thought of. Furthermore, numerous subsets of equations from equation (21) can be thought of to solve for numerous subsets of parameters. We limit ourselves to providing constraints for combining and substituting parameters.

EXAMPLE 2

Combining Parameters

Suppose we can measure the plane height at two positions $s_4^\alpha(x,y)=(-1,-1)$ and $s_5^\alpha(x,y)=(1,1)$ yielding $s_{z_4}^\alpha$ and $s_{z_5}^\alpha$. Then, the system describing the parameter relations yields:

$$\begin{bmatrix} 1 & -1 & 1 \\ 1 & 1 & 1 \end{bmatrix} \begin{bmatrix} s_{z_0}^\alpha \\ R_y \\ R_x \end{bmatrix} = \begin{bmatrix} s_{z_4}^\alpha \\ s_{z_5}^\alpha \end{bmatrix} \quad (22)$$

The rank of the coefficient matrix indicates that we can only solve equation (22) for two parameters. Therefore, we define a combined parameter $$R_{xy} = R_x + R_y, \quad (23)$$

and substitute this combined parameter into (22) to obtain the following system with full rank:

$$\begin{bmatrix} 1 & -1 \\ 1 & 1 \end{bmatrix} \begin{bmatrix} s_{z_0}^\alpha \\ R_{xy} \end{bmatrix} = \begin{bmatrix} s_{z_4}^\alpha \\ s_{z_5}^\alpha \end{bmatrix} \quad (24)$$

Now, the tilt of the plane can be determined versus the line $x=y$. Adding Equations (23, 24) to (22) results in the following system of geometric relations:

$$\begin{bmatrix} 1 & -1 & -1 & 0 & -1 & 0 \\ 1 & 1 & 1 & 0 & 0 & -1 \\ 0 & 1 & 1 & -1 & 0 & 0 \\ 1 & 0 & 0 & -1 & -1 & 0 \\ 1 & 0 & 0 & 1 & 0 & -1 \end{bmatrix} \begin{bmatrix} s_{z_0}^\alpha \\ R_x \\ R_y \\ R_{xy} \\ s_{z_4}^\alpha \\ s_{z_5}^\alpha \end{bmatrix} = 0 \quad (25)$$

We define an estimate $\tilde{x}$ of parameter x with error $\Delta x$ as follows:

$$\tilde{x} \equiv x + \Delta x \quad (26)$$

In certain circumstances, it is allowed to assume that the parameter coefficients can be estimated accurately enough to neglect their errors, i.e., $$\tilde{a} = a + \Delta a \approx a \quad (27)$$

In the plane example this is the case as the measured plane is nearly parallel to the XY plane and the measurement positions lie relatively far apart. Therefore, the height and tilt parameters are relatively insensitive for small deviations in the measurement position coefficients. If the role of parameters and coefficients were exchanged, the assumption would not be justified. In that case, the height and tilt 'coefficients' would form the basis to determine the (xy) position 'parameters' of the sensors from. In that case, the (x,y) position is relatively sensitive for small deviations in the tilt of the plane.

If the circumstances mentioned above apply, linear system (21) can be written in terms of parameter errors as follows:

$$A_{pc}\tilde{x}_{pc} = \tilde{b}_{pc}, \; A_{pc}(x_{pc}+\Delta x_{pc}) = b_{pc}+\Delta b_{pc} \quad (28)$$

Subtracting exact relation (21) from estimate relation (28) yields the relation between parameter errors:

$$A_{pc}\Delta x_{pc} = \Delta b_{pc}, \quad (29)$$

We can conclude that in certain circumstances, both parameter values and parameter errors are equally related. For convenience, we omit $\Delta$ in the remainder of this embodiment.

The parameter errors show some distribution. Such a parameter error is referred to as parameter inaccuracy below. To determine whether parameters are in capture range of a sensor, or whether a calibration sequence results in the required inaccuracy, the limit of the absolute error is of importance. A straightforward approach to express inaccuracy is to consider the worst case error bound. A more realistic approach is a statistical approach, using a distribution that is characterized by a mean and a variance. In whatever form the inaccuracy is expressed, the linear system (21) composed in the previous subsection can be used for deriving parameter inaccuracies for other parameters inaccuracies: computation tasks. Using measurements, parameters (or their inaccuracy) can be obtained directly. We can extend (21) for deriving parameter inaccuracies resulting from measurements by adding sensor inaccuracies to $b_{pc}$ and rows indicating the measured parameters to $A_{pc}$:

$$A_{pcm}x_{pc} = b_{pcm} \quad (30)$$

EXAMPLE 3

Sensor Inaccuracies

In the plane positioning example, we measure the height $s_{z_p}^\alpha$ of a point p in the plane with a certain inaccuracy $\beta_p$. Adding the sensor inaccuracies for the two measurements yields the following system:

$$\begin{bmatrix} 1 & -1 & -1 & 0 & -1 & 0 \\ 1 & 1 & 1 & 0 & 0 & -1 \\ 0 & 1 & 1 & -1 & 0 & 0 \\ 1 & 0 & 0 & -1 & -1 & 0 \\ 1 & 0 & 0 & 1 & 0 & -1 \\ 0 & 0 & 0 & 0 & 1 & 0 \\ 0 & 0 & 0 & 0 & 0 & 1 \end{bmatrix} \begin{bmatrix} s_{z_0}^\alpha \\ R_y \\ R_x \\ R_{xy} \\ s_{z_4}^\alpha \\ s_{z_5}^\alpha \end{bmatrix} = \begin{bmatrix} 0 \\ 0 \\ 0 \\ 0 \\ 0 \\ \beta_4 \\ \beta_5 \end{bmatrix} \quad (31)$$

Now, the parameter vector contains parameter inaccuracies. The vector of known constants contains both known constant inaccuracies (all zero in this example) and sensor inaccuracies.

We have deducted the linear parameter relations for the CS and IS measurements in the mask stage alignment case from the vector relations depicted in FIG. 24A. This deduction involves considering a zeroing error, a lens-to-stage offset and the vector coordinates transformation as depicted in FIG. 26 for the XZ plane. Symbols used in this figure include the following:

Metro Frame coordinate system or wafer stage zeroing coordinate system (WZ_CS) with base $\vec{\epsilon} = (\vec{e}_x, \vec{e}_y, \vec{e}_z)$.

Vector $\vec{f}$ from the WZ_CS origin to the image point to be measured, and $\epsilon$-coordinates $(f_x^\epsilon, f_y^\epsilon, f_z^\epsilon)$ of the vector $\vec{f}$.

Lens to metro frame height $\sigma_z^\epsilon$.

Lens to metro frame Y-tilt $R_y^{\epsilon y}$.

Substrate table coordinate system (WT_CS) with base $\vec{\alpha}=(\vec{\alpha}_x, \vec{\alpha}_y, \vec{\alpha}_z)$.

Vector $\vec{s}$ from the WT_CS origin to the WZ_CS origin, and $\alpha$-coordinates $(s_{x_C}{}^\alpha, s_{y_C}{}^\alpha, s_{z_C}{}^\alpha)$ of the vector $\vec{s}$.

$\alpha$-coordinates $(f_x{}^\alpha, f_y{}^\alpha, f_z{}^\alpha)$ of the vector $\vec{f}$.

Wafer stage zeroing height error $s_{z_0}{}^\alpha$.

Wafer stage zeroing Y-tilt error $R_{y_0}$.

Lens coordinate system (LCS) with base $\vec{c}=(\vec{c}_x, \vec{c}_y, \vec{c}_z)$.

Image plane height in LCS $j_{z_0}{}^\epsilon$.

Image plane Y-tilt in LCS $R_{y_F}{}^\gamma$.

The machine design and initial situation at the start of the sequence justifies that several geometric parameters can be considered as several known constants. Furthermore, the deducted coefficients are such that small deviations in them have a negligible effect on the parameters. Therefore, the obtained linear relations as formulated in (32a and b below) can also be used to relate parameter inaccuracies:

$$s_{z_c}{}^\alpha + s_{z_0}{}^\alpha + R_{y_0} s_{x_c}{}^\alpha = \beta_{cs} \quad (32a)$$

$$s_{z_c}{}^\alpha + \sigma_z{}^\epsilon - (R_y{}^{\tau\epsilon} - R\gamma_{y_0}) f_x{}^\epsilon + R_{y_0} s_{x_c}{}^\alpha = \beta_{IS} \quad (32b)$$

Figure 26A:
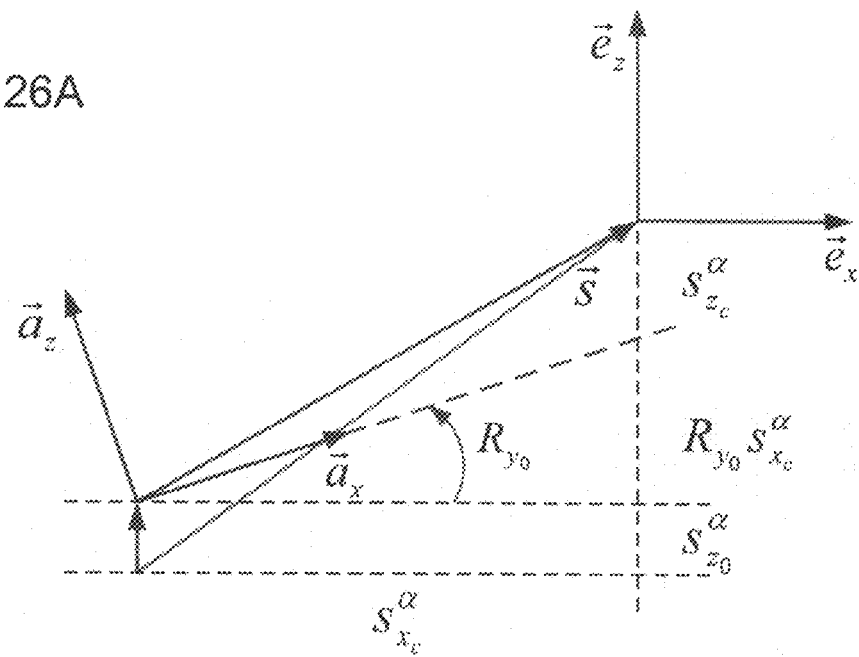
FIG. 26A depicts a zeroing error.
Figure 26B:
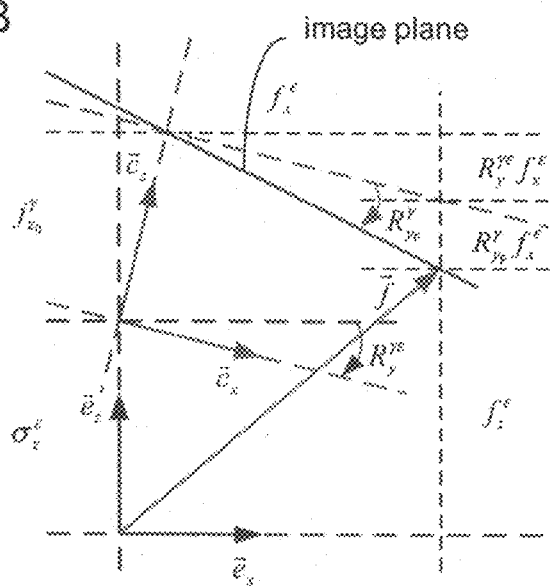
FIG. 26B depicts a lens-to-stage offset.
Figure 26C:
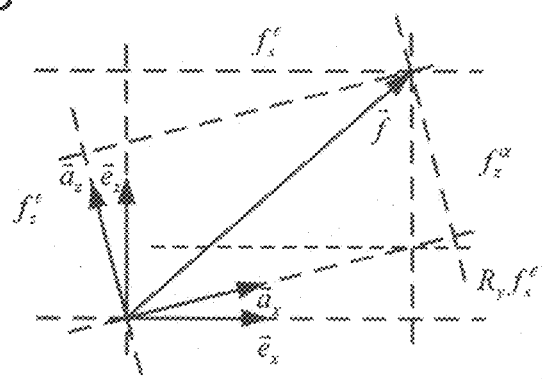
FIG. 26C depicts a vector coordinates transform.

For CS, relation (19a) involves a zeroing error only (FIG. 26A). For IS, relation (26) involves both a zeroing error (FIG. 26A) and a projection system-to-stage offset (FIG. 26B). As the lens-to-stage offset involves both the $\alpha$ and $\epsilon$ coordinate systems, relation (32b) also involves the vector coordinates transformation (FIG. 26C).

Measurements can be done at two $s_{z_c}{}^\alpha$ positions, a and b. Per $s_{z_c}{}^\alpha$ position, one CS sensor unit is available, each having its own $s_{z_c}{}^\alpha$ parameter. For $s_{z_c}{}^\alpha$ position a, four IS sensor units are available. Each sensor unit has its own $f_x{}^\epsilon$ coefficient, whereas each combination of measurement position and IS unit has its own $s_{z_c}{}^\alpha$ parameter. Therefore, Equation (32a) for CS can be expanded as follows:

$$s_{z_{ca}CS} + s_{z_0}{}^\alpha + R_{y_0} s_{x_{ca}}{}^\alpha = \beta_{aCS}, \quad (33a)$$

$$s_{z_{cb}CS}{}^\alpha + s_{z_0}{}^\alpha + R_{y_0} s_{x_{cb}}{}^\alpha = \beta_{bCS}, \quad (33b)$$

whereas (32b) can be expanded as follows:

$$s^a_{z_c,aIS_i} + \sigma_z^\epsilon - (R_y^{\tau\epsilon} - R_{y_0}) f^\epsilon_{x_{IS_i}} + s^a_{z_0} + R_{y_0} s_{x_{c,a}} = \beta_{aIS_i}, \quad i=1,2,3,4, \quad (34a)$$

$$s^a_{z_c,bIS_i} + \sigma_z^\epsilon - (R_y^{\tau\epsilon} - R_{y_0}) f^\epsilon_{x_{IS_i}} + s^a_{z_0} + R_{y_0} s_{x_{c,b}} = \beta_{bIS_i}, \quad i=1,2. \quad (34b)$$

Some examples of combined parameters are:

$$\tau_z^\epsilon = \sigma_z^\epsilon + s_{z_0}{}^\alpha, \quad (35a)$$

$$\nu_z{}^\alpha = s_{z_0}{}^\alpha + R_{y_0} s_{x_c}{}^\alpha. \quad (35b)$$

These combined parameters can be substituted into (32) yielding the following equations:

$$\{\tau_z^\epsilon\}: s_{z_c}{}^\alpha + \tau_z^\epsilon - (R_y^{\gamma\epsilon} - R_{y_0}) f_x^\epsilon + R_{y_0} s_{x_c}{}^\alpha = \beta_{IS}, \quad (36a)$$

$$\{\nu_z^\epsilon\}: s_{z_c}{}^\alpha + \sigma_z^\epsilon - (R_y^{\gamma\epsilon} - R_{y_0}) f_x^\epsilon + \nu_z{}^\alpha = \beta_{IS}. \quad (36b)$$

Note that these equations can also be instantiated for the different measurement positions.

Figure 10:
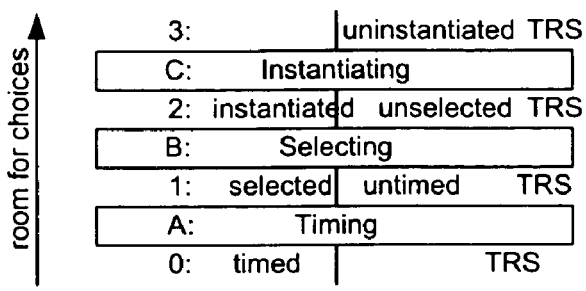
FIG. 10 shows a layered TRS framework.

This next section describes the constraints for instantiating a calibration task graph (instantiated, unselected TRS (2) in FIG. 10): the uninstantiated TRS (3) in FIG. 10). First, we consider parameter errors without variance. We define the system state and the TRS definition elements that parameterize the instantiation constraints, based on which we define the constraints afterwards. Then, we describe the consequences of adding variance to the parameter errors. Finally, we convert a sequence of calibration tasks into an instantiated unselected TRS, thus incorporating parallelism possibilities.

A. Uninstantiated System Definition.

Let the elements in parameter vector $x_{pc}$ be contained in set $\chi$. Assuming that the parameter errors contain no variance, we define the state of a system with respect to parameter errors by $Sx: \chi \rightarrow \mathbb{R} \cup \{\bot\}$. Giving the error value of each parameter, which can also be undefined ($\bot$).

Whereas tasks in an instantiated TRS have a precedence relation, this is not the case for an uninstantiated TRS. Tasks can be instantiated from so-called meta-tasks. A computation metatask involves deriving a certain—solvable sized—subset of parameters from a certain subset of equations from (8). Although there is no precedence relation between meta-tasks, constraints exist for instantiating meta-tasks ensuring that the resulting instantiated TRS definition is feasible: pre-conditions. A computation can be executed if all input parameters are defined.

A measurement can only be executed successfully if the parameter inaccuracies are in capture range. These measurement capture range constraints can also be defined in matrix form:

$$Cx_{pc} \leq d. \quad (37)$$

Here, d contains capture ranges, and C contains coefficients that indicate which parameters are of importance for a certain measurement. Furthermore, execution of a meta-task results in changed error values of certain calibration parameters, which can be associated with post-conditions.

EXAMPLE 4

Capture Range

For a successful measurement, the point to be measured must be placed in capture range of the sensor. In the plane positioning example, the capture range expresses how close to the point to be measured the sensor needs to be positioned in order to capture the target. To be able to do so, we need a height estimate of the point to be measured that is accurate enough. Let $d_p$ denote the capture range of a measurement of point p, i.e., the maximum allowed inaccuracy $s_{z_p}{}^\alpha$ of a height estimate of point p. We can define the following constraints for the two height measurements:

$$\begin{bmatrix} 0 & 0 & 0 & 0 & 1 & 0 \\ 0 & 0 & 0 & 0 & 0 & 1 \end{bmatrix} \begin{bmatrix} s_{z_0}^\alpha \\ R_y \\ R_x \\ R_{xy} \\ s_{z_4}^\alpha \\ s_{z_5}^\alpha \end{bmatrix} \leq \begin{bmatrix} d_4 \\ d_5 \end{bmatrix} \quad (38)$$

The elements of an uninstantiated TRS (level 3 in FIG. 10) that define calibration meta-task pre- and post-conditions can be defined as follows:

$\mathcal{T}_3$ is a finite set of uninstantiated calibration tasks, or meta-tasks. Two types of calibration meta-tasks exist:

measurements and computations $\mathcal{T}_3 = \mathcal{T}_{m3} \cup \mathcal{T}_{c3}$ $Cb_3, Ce_3: \mathcal{T}_3 \rightarrow \mathcal{P}(\chi) \times \mathcal{P}(\mathbb{N})$ give the parameters involved in the pre-condition (input parameters) and in the post-condition (output parameters) of a meta-task. The meaning of the tuple elements depends on the type of meta-task and pre-condition or post-condition, and is given in the following table:

|  | Measurement: $t_3 \in T_{m3}$ | Computation: $t_3 \in T_{c3}$ |
|---|---|---|
| $Cb_3(t_3).0$ | Input parameters | Input parameters |
| $Ce_3(t_3).0$ | Output parameters | Output parameters |
| $Cb_3(t_3).1$ | Equations of (37) used in pre-condition (rows of C and d) | Equations of (30) used |
| $Ce_3(t_3).1$ | Equations of (30) used in post-condition (rows of $A_{pcm}$ and $b_{pcm}$) | Equations of (30) used |

Constraints on these definitions that follow from their meaning described in the previous section are:

1. For measurements, the equations of (37) identified by $Cb_3(t_{m3}).1$ involve exactly the input parameters: $Cb_3(t_{m3}).0$. This implies that the columns of C corresponding with the remaining parameters contain only zeros at the identified rows. On the other hand, the equations of (30) identified by $Ce_3(t_{m3}).1$ involve exactly the output parameters: $Ce_3(t_{m3}).0$. Hence, the columns of $A_{pcm}$ corresponding with the remaining parameters contain only zeros at the identified rows.

2. For computations, $Cb_3(t_{c3}).1$ and $Ce_3(t_{c3}).1$ identify the same equations of (30) involving exactly the input and the output parameters: $Cb_3(t_{c3}).0 \cup Ce_3(t_{c3}).0$. The columns of $A_{pcm}$ corresponding with the remaining parameters contain only zeros at the identified rows.

3. The number of output parameters of a meta-task $|Ce_3(t_3).0|$ may not exceed the number of solvable parameters given the equations of (30) used, identified by $Ce_3(t_3).1$.

B. Instantiating a Calibration Sequence

This subsection describes two functions: one to determine which meta-tasks are eligible to be instantiated in a certain system state, and one to update the system state for the execution of a meta-task. These functions can be used to verify a calibration sequence and can be embedded in an algorithm to automatically generate calibration sequences, similar to the previous embodiment.

We say that C is of size m×n, meaning that it has m rows and n columns. By $c_{ij}$ we denote the element of C at the ith row and the jth column. By $x_j$ we denote the element of x at the jth row, or $Sx(j)$. By $d_i$ we denote the element of d at the ith row. Let function eligible:$(X \to \mathbb{R} \cup \{\bot\}) \to \mathcal{P}(\mathcal{T}_3)$ be a function that determines which meta-tasks are eligible to be instantiated in a certain system state (Sx):

$$\text{eligible}(Sx) = \{t | t \in T_3, precond(t, sx)\}. \tag{39}$$

Function precond:$Sx(X \to \mathbb{R} \cup \{\bot\}) \to \mathbb{B}$ is a function that determines whether the pre-conditions of a meta-task are satisfied in some system state:

$$\text{precond} : (t, Sx) = (\forall j : j \in Cb_3(t).0 : Sx(j) \neq (\bot)) \land \tag{40}$$
$$(t \in T_{m3} \Rightarrow (\forall i : i \in Cb_3(t).1 : \sum_{j=1}^{n} c_{ij} x_j \leq d_i)).$$

We use $\mathbb{B}$ to denote the set of Boolean values: $\mathbb{B} = \{true; false\}$. Function precond checks whether all input parameters are defined and in case of a measurement also whether the input parameter inaccuracies are in capture range.

To update the system state, we wish to express the values of the state variables that are updated as a function of the old state. To be able to do so, we introduce a composed vector $\vec{\chi}$ and rewrite (30) into $$\overline{A}\overline{x} = 0 \tag{41}$$

where $$\overline{A} = [A_{pcm} - I], \quad \overline{x} = \begin{bmatrix} x_{pc} \\ b_{pcm} \end{bmatrix} \tag{42}$$

Let $\overline{x}_t$ denote the inaccuracies of the parameters and knowns involved in meta-task t. For each meta-task t, a matrix $P_t$ can be defined that extracts $\overline{x}_t$ from $\overline{x}$:

$$\overline{x}_t = P_t \overline{x}. \tag{43}$$

Furthermore, a matrix $Q_t$ can be defined that selects the relevant rows from A. Using $Q_t$ and $P_t$, we can define a matrix $\overline{A}_t$ that contains the coefficients for meta-task t as follows:

$$\overline{A}_t = Q_t \overline{A} P_t^T. \tag{44}$$

Equations (43, 44) can be used to select the parameter relations involved in meta-task t from (28) as follows:

$$Q_t \overline{A} P_t^T T \overline{x} = 0. \tag{45}$$

We can separate the input and output parameter inaccuracies in (45) as follows:

$$Q_t \overline{A} \begin{bmatrix} P_t^{in^T} & P_t^{out^T} \end{bmatrix} \begin{bmatrix} P_t^{in} \\ P_t^{out} \end{bmatrix} \overline{x} = 0. \tag{46}$$

Bringing the input parameter inaccuracies to the right-hand side yields:

$$Q_t \overline{A} P_t^{out^T} P_t^{out} \overline{x} = -Q_t \overline{A} P_t^{in^T} P_t^{in} \overline{x}. \tag{47}$$

Let $\overline{x}_t^{out'}$ denote a solution for the output parameter inaccuracies after execution of meta-task t. A solution exists if the constraints for the uninstantiated TRS definition are satisfied. Using the pseudo-inverse of $Q_t \overline{A} P_t^{out^T}$, denoted by $(Q_t \overline{A} P_t^{out^T})^+$, we find the following solution:

$$\overline{x}_t^{out'} = P_t^{out^T} \overline{x} = -(Q_t \overline{A} P_t^{out^T})^+ Q_t \overline{A} P_t^{in^T} P_t^{in} \overline{x}. \tag{48}$$

When system (47) is fully determined, (48) provides an exact solution. In the case that (47) is overdetermined, an approximate least-squares solution is provided by (48). We can now express the inaccuracies of the updated parameters as a function of the old state as follows:

$$\overline{x}_t^{out'} = U_t^{out} \overline{x} \tag{49a}$$

where $$U_t^{out} = -(Q_t \overline{A} P_t^{out^T})^+ Q_t \overline{A} P_t^{in^T} P_t^{in}. \tag{49b}$$

Updating the system state for the execution of a meta-task t can be described in the form $$\overline{x}_t' = U_t \overline{x} \tag{50}$$

Only the output parameters in $\overline{x}$ need to be updated by the update matrix $U_t$. We can construct $U_t$ from an appropriately sized identity matrix and $U_t^{out}$ by replacing the rows of the identity matrix corresponding with the output parameters by the corresponding rows of $U_t^{out}$.

C. Adding Parameter Inaccuracy Variance

To incorporate a calibration parameter distribution having a mean and variance component, we extend the state of a system such that $Sx: \chi \to \mathbb{R} \cup \{\perp\} \times \mathbb{R}_0^+ \cup \{\perp\}$ gives the mean and variance of the inaccuracy of each parameter, which can also be undefined $\{\perp\}$. Let $\vec{\chi}^\mu$ denote the vector of mean values of parameter inaccuracies, and let $\vec{\chi}^{\sigma^2}$ denote the vector of variance values of parameter inaccuracies.

To check whether the pre-condition of a measurement meta-task is satisfied, the maximum absolute value of the input parameters must be considered. This maximum absolute error can be derived from the mean and the variance of the parameter inaccuracies. Redefining function eligible: $(\chi \to \mathbb{R} \cup \{\perp u\} \times \mathbb{R}_0^+ \cup \{\perp\}) \to \mathcal{P}(\mathcal{T}_3)$ for the added variance concerns only redefining function precond: $\mathcal{T}_3 \times (\chi \to \mathbb{R} \cup \{\perp\} \times \mathbb{R}_0^+ \cup \{\perp\}) \vee \mathbb{B}$:

$$\text{precond}(t, Sx) = (\forall j: j \in Cb_3(t).0 : Sx(j).0 \neq \perp \wedge Sx(j).1 \neq \perp) \quad (51)$$

$$\wedge \left( t \in \mathcal{T}_{m3} \Rightarrow \left( \forall i: i \in Cb_3(t).1 : \sum_{j=1}^{m} c_{ij} \left| x_j^\mu + c\sqrt{x_j^{\sigma^2}} \right| \leq d_i \right) \right)$$

Scalar c can be chosen using Chebychev's inequality, $$P(|x_j - x_j^\mu| \geq c\sqrt{x_j^{\sigma^2}}) \leq 1/c^2, \quad (52)$$

which implies that the probability that a random parameter differs from its mean by at least c standard deviations is less than or equal to $1/c^2$ (Montgomery and Runger, [Applied Statistics and Probability for Engineers, John Wiley & Sons V7 1994]).

From statistics, we know how to derive the mean and variance value $y^\mu$ and $y^{\sigma^2}$ of a linear combination L of variables x, each having a mean and variance $y^\mu$ and $y^{\sigma^2}$:

$$y^\mu = Lx^\mu \quad (53a)$$

$$y^{\sigma^2} = L^2 x^{\sigma^2}. \quad (53b)$$

Here, $L^2$ denotes a matrix containing the pointwise squared elements of L.

However, the restriction for the derivation of variance values using (53) is that the input parameters are independent random parameters, which is not generally the case. In fact, a computation task by definition results in output parameters that depend on the input parameters. If these parameters are used together as inputs later in the sequence, (53) cannot be used anymore. We assume that the initial parameter inaccuracies, i.e., the parameter inaccuracies defined before calibration starts, and the parameter inaccuracies resulting from measurements are independent. To be able to calculate the state transition from the current state, we somehow have to log the dependencies of parameters $\bar{x}$ as a function of the independent parameters $\bar{x}_i$. Therefore, we define $$\bar{x} = L_i \bar{x}_i, \quad (54)$$

where $L_i$ is a linear transformation from the independent parameter vector $\bar{x}_i$ to current parameter vector $\bar{x}$. We add $L_i$ to the system state.

Substituting (41) into (37) yields:

$$\bar{x}' = U_t L_i \bar{x}_i. \quad (55)$$

Because $\bar{x}_i$ contains only independent parameters, applying (53) to (55) yields:

$$\bar{x}^\mu{}' = U_t L_i \bar{x}_i^\mu, \quad (56a)$$

$$x^{\sigma^2}{}' = (U_t L_i)^2 x^{\sigma^2}. \quad (56b)$$

Hence, we can use the update matrix $U_t$ to update $L_i$ for the effect of execution of meta-task t:

$$L'_i = U_t L_i. \quad (57)$$

It appears that the inaccuracies can be derived from the inaccuracies of the initial independent parameters and knowns, $\bar{x}_i^0$. Therefore, we can replace $\bar{x}$ by $L_i$ in the system state if we add $\bar{x}_i^0$ to the system definition. Concluding, the initial system state can be defined by $\bar{x}_i^0$, and $L_i$ is suited to define the current state. Initially, $L_i^0$ equals I. The following elements together parameterize the constraints that play a role in instantiating a calibration sequence (uninstantiated TRS):

Equation (37): $Cx_{pc} \leq d$, defining the capture ranges of measurements (pre-conditions).

Equation (41): $\overline{Ax} = 0$, defining the linear relation between parameter inaccuracies, both for computations and measurements (post-conditions).

$\mathcal{T}_3 = \mathcal{T} \cup \mathcal{T}_{c3}$, defining the set of available meta-tasks.

$Cb_3, Ce_3: \mathcal{T}_3 \to \mathcal{P}(\chi) \times \mathcal{P}(\mathbb{N})$, defining the meta-task pre-conditions and post-conditions by associating them with the relevant parts of (37) and (41).

To be able to schedule the calibration sequence for timing analysis, the capabilities involved with resources need to be defined, denoted by I3 : T3→P(C). This information is not used for instantiating a calibration sequence.

D. Conversion of a Calibration Sequence into an Instantiated Unselected TRS

To convert a calibration sequence cs into a level 2 TRS definition in the calibration domain, denoted by $D_2^{cal}$, we call the recursive function convert with ($\epsilon$, cs) as argument. During recursion, the internal variable mapcs is used to record the mapping of the instantiated meta-tasks to tasks and to determine the task precedence relation.

$$\text{convert}(mapcs, cs) = \begin{cases} D_2^\epsilon & \text{if } cs = \varepsilon \\ \text{convert}(mapcs++ \\ [(hd(cs), t_2)], & \text{if } cs \neq \varepsilon. \\ tl(cs)) \cup D_2' \end{cases} \quad (58)$$

where $D_2^\epsilon$ denotes the empty TRS definition and $\epsilon$ denotes the empty sequence. The tuple $(t_2; D_2')$ is specified by addtask(mapcs,hd(cs)).

Function addtask:$(\mathcal{T}_3 \times \mathcal{T}_2)^* \times \mathcal{T}_3 \to (\mathcal{T}_2 \times \mathcal{D}_2)$ instantiates a task $t_2$ for an instantiated meta-task $t_3$ to extend the level 2 TRS definition $D_2$. This is obtained by adding an additional task $t_2$ to the existing TRS definition $D_2$, copying the capabilities involved, and instantiating for each input parameter of $t_2$ a precedence edge from the previous task in the calibration sequence that had that parameter as an output parameter. Given a map sequence mapcs, addtask(mapcs; $t_3$) specifies a tuple $(t_2; D_2')$ such that:

$$t_2 \in \mathcal{T}'_2 \wedge t_2 \notin \mathcal{T}_2 \quad (59)$$

$$\wedge (\forall c: c \in I_3(t_3) : c \in I'_2(t_2))$$

-continued $$\bigwedge (\forall\, x,\, xcs{:}x \in Cb_2(t_3).0,\, xcs = filterxcs(mapcs,\, x){:}$$

$$(hr(xcs).1,\, t_2) \in P'_2)$$

Function filterxcs:$(\mathcal{T}_3 \times \mathcal{T}_2)^* \times \chi \rightarrow (\mathcal{T}_3 \times \mathcal{T}_2)^*$ filters the tasks from a map sequence mapcs that have some parameter x as output parameter:

$$filterxcs(mapcs,\, x) = \begin{cases} \varepsilon & \text{if } mapcs = \varepsilon \\ filterxcs & \text{if } mapcs \neq \varepsilon \wedge \\ (tl(mapcs),\, x) & x \notin Ce_3 \\ & (hd(mapcs).0).0. \\ [hd(mapcs)] {+}{+} & \text{if } mapcs \neq \varepsilon \wedge \\ filterxcs & x \in Ce_3 \\ (tl(mapcs),\, x) & (hd(mapcs).0).0. \end{cases} \quad (60)$$

In this section, we analyze an example Reticle Stage Align (RSA) sequence taken from a known lithographic apparatus. The following sequence of leveling-related measurements is performed in this RSA sequence:
1) A CS measurement at position a: aCS.
2) An IS measurement at position a with medium accuracy: aIS-M.
3) An IS measurement at position a with fine accuracy: aIS-F.
4) A CS measurement at position b: bCS.
5) An IS measurement at position b with fine accuracy: bIS-F.

The capture ranges and inaccuracies for the different types of measurements are listed in Table I. Several computations are performed in between the measurements. Table II presents the initial inaccuracy as well as the desired inaccuracy after calibration.

TABLE I

CAPTURE RANGES AND INACCURACIES FOR THE MEASUREMENTS IN RSA.

| Measurement | Parameter $\chi_j$ | Capture $\|x_j^\mu + 3x_j^\sigma\| \leq$ | Inaccuracy $3x_j^\sigma$ | Unit $10^{-6}$ |
|---|---|---|---|---|
| CS | $x_z^\alpha$ | 5.0 | 0.06 | [m] |
| IS Medium | $S_{z_0}^\alpha$ | 1.0 | 0.1 | [m] |
| IS Fine | $S_{z_c}^\alpha$ | 0.25 | 0.025 | [m] |

TABLE II

INITIAL, DESIRED, AND PREDICTED INACCURACY OF RSA.

| Parameter $\chi_j$ | Initial error $6x_j^\sigma$ | Desired error $\|x_j^\mu + 3x_j^\sigma\| \leq$ | Predicted error $\|x_j^\mu + 3x_j^\sigma\|$ | Unit $10^{-6}$ |
|---|---|---|---|---|
| $\sigma_z^\varepsilon$ | 0.20 | $\perp$ | 0.100 | [m] |
| $s_{z_0}^\alpha$ | 1.5 | $\perp$ | 0.042 | [m] |
| $R_y^{\tau\varepsilon}$ | 8.0 | 1.3 | 1.076 | [rad] |
| $R_{y_0}^\tau$ | 4.0 | 0.1 | 0.093 | [rad] |
| $\tau_z^\varepsilon$ | $\perp$ | 0.014 | 0.012 | [m] |

Figure 27:
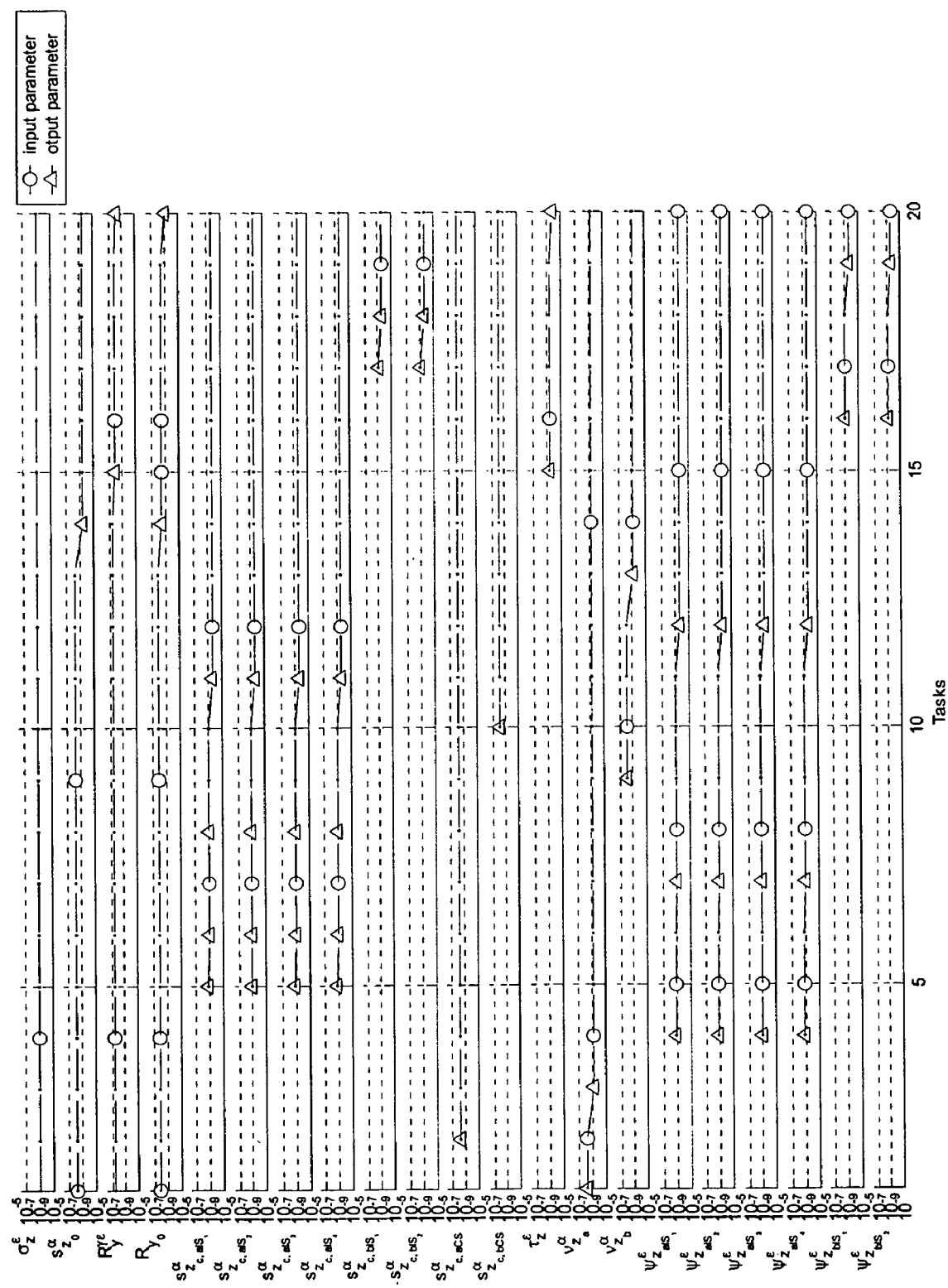
FIG. 27 shows a trajectory of predicted inaccuracies along tasks in a Reticle Stage Align (RSA) sequence.

The theory described above has been implemented in MATLAB, and the RSA sequence simulated using the theory. FIG. 27 shows the trajectory of the predicted inaccuracies along the tasks in the RSA sequence. The parameter of image point height in LCS is indicated by $\psi_z^\varepsilon$.

In FIG. 27, every involved parameter or combined parameter is plotted on its own axes. The horizontal axis represent the tasks in the RSA sequence, whereas the vertical axis represent the parameter inaccuracy on a logarithmic scale, i.e., the predicted maximum parameter error (c=3). The task numbers correspond with the order in which the meta-tasks are instantiated in the RSA. Only the top four parameters are defined at the beginning of the sequence $\overline{x}_i^o$. The remaining parameters are computed along the sequence. The circular-shaped markers indicate the input parameters for each computation task, whereas the triangular-shaped markers indicate the output parameters for each calibration task.

The slope of the lines in FIG. 27 shows that measurements in a lithographic apparatus cause inaccuracy improvements of approximately one order of magnitude: tasks 3, 6, 11, 13, 18. Because of this, the computations can also change the inaccuracy with that order of magnitude. Most computations in the RSA sequence involve simple substitutions.

However, computation tasks 14 through 16 demonstrate the dependencies between the different computations. Within these three tasks, two computation tasks (tasks 14 and 15) are involved that actually solve a linear system. Note that due to the sequential order of solving the linear systems, the computation sequence 14 through 16 predicts different inaccuracies than in the case that the involved parameter relations were solved at once. Update matrix $U_t$ and logging matrix $L_i$ ensure that the sequential computations are performed in terms of independent random parameters only. Every calibration task in the sequence influences the inaccuracy of at least one parameter. Notice the redundancy of tasks 6 and 7, which is caused by the implementation of RSA in the wafer scanner.

Figure 28:
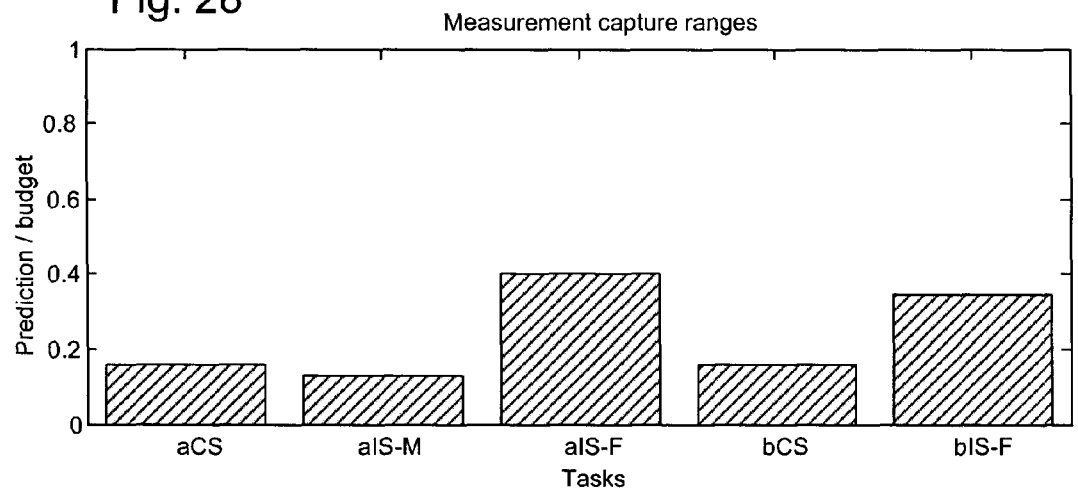
FIG. 28 shows a ratio between predicted parameter error and specified capture range.
Figure 30:
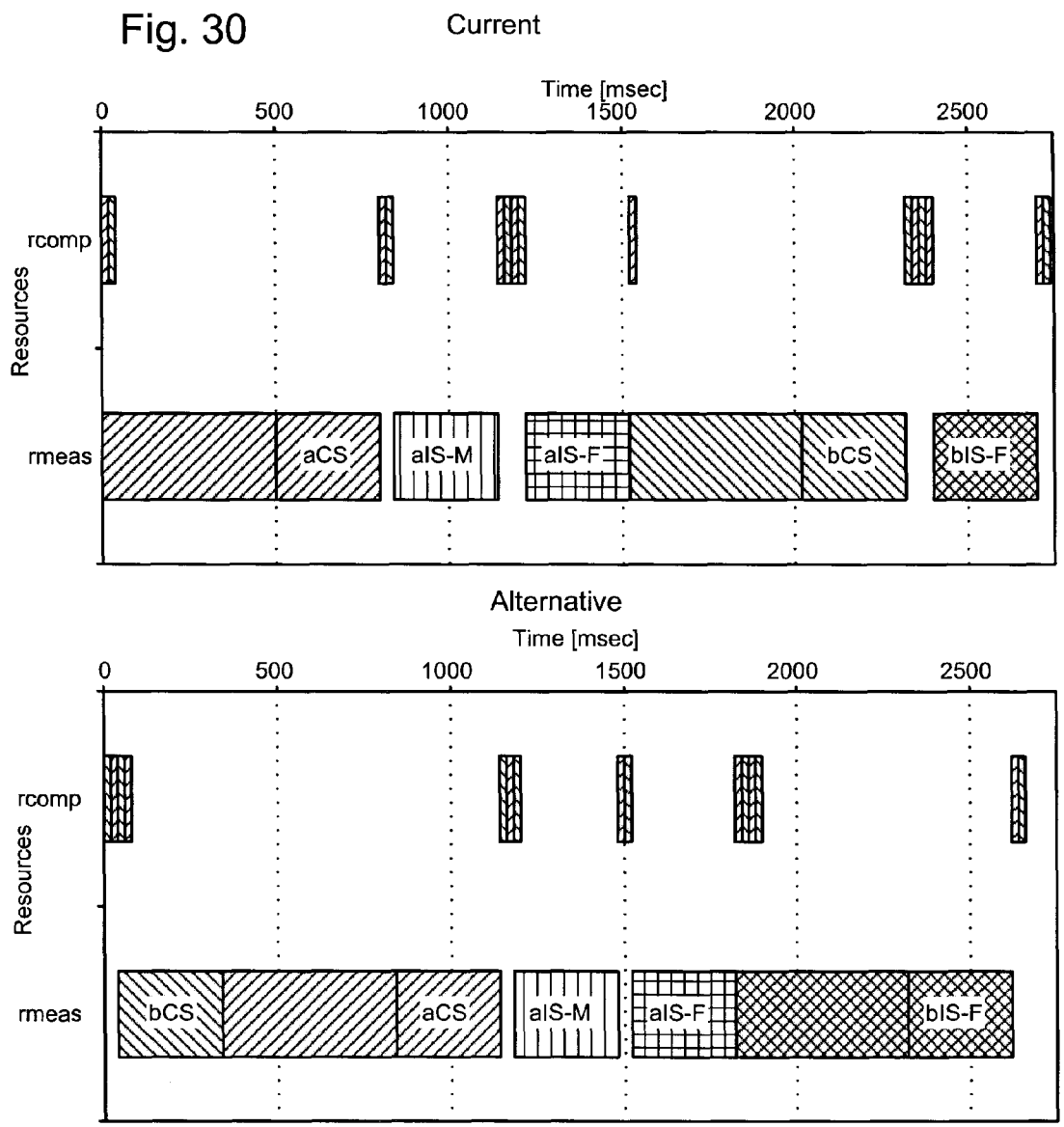
FIG. 30 shows two possible schedules.

The instantiated RSA sequence can be verified by comparing the predicted inaccuracies before each measurement with the specified capture ranges, and comparing the predicted and desired end inaccuracies. FIG. 28 shows the ratio between the predicted maximum parameter error ($|x_j^\mu + 3x_j^\sigma|$) and the specified capture range for the measurements in the RSA sequence. From FIG. 28 we conclude that the predicted inaccuracies are all well in capture range. This raises the question whether or not an RSA sequence with fewer operations or shorter measurements is also possible. The predicted end inaccuracies are depicted in Table II. From this table we can conclude that the desired end inaccuracy is reached.

To be able to predict timing performance, the parameter dependencies between the tasks can be converted into a task precedence graph, which is displayed in FIG. 28. Using the theory described two possible schedules (see FIG. 29) can be generated, both satisfying the task precedence graph. Note that besides the task precedence graph, additional information must be defined. The resources involved with measurements are modeled as resource rmeas, whereas computations are performed by resource rcomp. The alternative schedule leads to a shorter completion time than the schedule currently implemented due to more use of parallelism between measurement and computation tasks.

High-precision machines have to perform on-line calibrations to correct for imperfections in materials and drift in machine hardware. To be able to compensate with the required accuracy, calibration requires a sequence of calibration operations involving measurements with multiple types of sensors and computations to interrelate their different kinematic chains. This example describes the constraints to be taken into account in instantiating a calibration sequence. These constraints can be associated with a layered TRS framework that is suited for application in SMC.

The state of the system during calibration can be defined in terms of inaccuracy values of geometric parameters. Preconditions on the system state that have to be satisfied to successfully execute a calibration operation are specified and post-conditions for execution of a calibration operation are determined by predicting the resulting state transition. These predictions follow from solving sets of linear equations relating the inaccuracy values of the geometric parameters. Inaccuracies are expressed by a mean and variance component to account for the random effects encountered in practice. An instantiated calibration sequence can be translated into a task precedence graph (TRS definition level 2) using the parameter dependencies in the sequence. From that point, existing scheduling theory and tools concerning the lower part of the TRS framework can be used for timing performance analysis.

The theory has been verified using an existing calibration sequence from a wafer scanner. Verification results confirm that the measurement input parameters are in capture range, and that the inaccuracy resulting after calibration suffices. Timing performance analysis shows that alternative schedules with different durations are possible. The described functionality can also be embedded in a search algorithm for automatic calibration sequence generation. Application of this theory in real-time SMC is possible.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning structure" used herein should be broadly interpreted as referring to structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning structure may be transmissive or reflective. Examples of patterning structure include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning structure, the support structure may be a frame or table, for example, which may be fixed or movable as required and which may ensure that the patterning structure is at a desired position, for example with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory acts may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Embodiments of the invention include a method of operating a machine forming at least a part of a lithographic apparatus or a lithographic processing cell, the method comprising: maintaining a state register representing the state of the machine; providing a task database relating to tasks that may be performed by said machine, said database including information relating to the beginning state of the machine required to perform each task and the end state of the machine after the task has been performed; constructing a plurality of different possible sequences of tasks that can be performed; and selecting one of said possible sequences of tasks that starts from a given beginning state of the machine and results in a desired end state of said machine; and performing the selected sequence of tasks.

By modeling the machine with reference to its state and recording the tasks it can perform in terms of the required beginning state and the end state produced by each task, possible sequences of tasks that can be performed by the machine can be generated rapidly and quickly searched to find an optimum sequence that ends in the desired state. Thus on-the-fly scheduling and optimization of scheduling can be performed, giving greater flexibility and increasing the utilization of the machine.

Preferably, the state register is adapted to represent exception states as well as states occurring in normal operation of the machine. Also, the task database preferably includes information relating to tasks that are performed during calibration of the machine, during machine start-up, during error-recovery and/or in a test mode, in addition to tasks carried out during normal operation of the machine to manufacture devices. In this way, such an embodiment enables recovery from unexpected errors; starting from an exception state, possible sequences of tasks are generated and searched for sequences that end with the machine in a normal state.

To make searching the plurality of constructed sequences more rapid, a number of techniques may be applied. These include detecting sequences that loop and removing the loop or rejecting the sequence. It is also possible to construct the sequences starting from the given beginning state or working backwards from the desired end state, or both. If constructing possible sequences working from the beginning or end states, the possible sequences may be arranged in a tree structure which can be built using known breadth first or depth first techniques, as convenient.

A method according to a further embodiment comprises maintaining a sequence database including information relating to task sequences that result in desirable end states starting from different beginning states; and prior to constructing a plurality of different possible sequences of tasks, searching said sequence database for a sequence that results in a desired end state starting from a current machine state.

The sequence database can be used to store information relating to sequences of tasks that are performed frequently and enables a rapid selection of a sequence of tasks when performing common jobs. Also, the sequence database can include tasks sequences that recover from error or exception states and may be added to when a new exception state is encountered and a task sequence to recover from it is found.

A similar effect may be achieved by including in said task database information relating to task clusters, where a task cluster is a sequence of tasks performable by the machine.

Similarly, a database of sequences ending in undesirable states, or that fail to improve matters may be maintained, so that such task sequences may be rejected in constructing or searching the generated possible sequences.

The machine may be the whole of a lithographic processing unit, comprising a lithographic apparatus and a track unit comprising wafer handling devices and pre- and post-processing devices, or just the lithographic apparatus or track unit or just a subsystem within the lithographic apparatus or track unit.

According to a further embodiment, a control system for operating a machine forming at least a part of a lithographic apparatus or a lithographic processing cell comprises a state register representing the state of the machine; an update mechanism for changing said state register to reflect changes in the state of the machine; a task database relating to tasks that may be performed by said machine, said database including information relating to the beginning state of the machine required to perform each task and the end state of the machine after the task has been performed; a sequence construction mechanism to construct a plurality of different possible sequences of tasks that can be performed; a search engine to search said plurality of possible sequences of tasks and selecting one of said possible sequences of tasks that starts from a given beginning state of the machine and results in a desired end state of said machine; and a control mechanism to control said machine to perform the selected sequence of tasks.

Embodiments of the invention also include a lithographic processing cell, a lithographic apparatus, and a track unit, each including a control system as described herein.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The description is not intended to limit the invention.

What is claimed is:

1. A method of operating a lithographic processing machine capable of performing a plurality of tasks and configured to have a plurality of states over time, each of the plurality of tasks being associated with a corresponding beginning state of the plurality of states, in which the machine is configured to initiate the task, and a corresponding end state of the plurality of states, in which the machine is configured to complete the task, the method comprising:

maintaining a state register representing a state of the machine at a corresponding time;

providing a task database relating each of the plurality of tasks with its corresponding beginning and end states;

based on the task database, constructing a plurality of possible sequences of tasks;

selecting one among said plurality of possible sequences that starts from a given beginning state of the machine and results in a desired end state of the machine;

selecting at least one among the group consisting of (A) said constructing a plurality of possible sequences and (B) said selecting one among said plurality of possible sequences comprises detecting and rejecting sequences that loop; and performing the selected possible sequence.

2. The method of operating a lithographic processing machine according to claim 1, wherein said state register is configured to represent (A) exception states of the machine and (B) states occurring during normal operation of the machine.

3. The method of operating a lithographic processing machine according to claim 1, wherein the task database includes information relating to tasks to be performed during operation of the machine for substrate processing, and wherein the task database includes information relating to tasks to be performed during at least one of the group consisting of calibration of the machine, start-up of the machine, an error-recovery mode of the machine, and a test mode of the machine.

4. The method of operating a lithographic processing machine according to claim 1, wherein said constructing a plurality of possible sequences is performed starting from said given beginning state.

5. The method of operating a lithographic processing machine according to claim 1, wherein said constructing a plurality of possible sequences is performed working backwards from said desired end state.

6. The method of operating a lithographic processing machine according to claim 1, said method comprising:

maintaining a sequence database including information relating to a plurality of sequences of tasks, each sequence in the plurality terminating in the same end state, and each sequence in the plurality starting from a different corresponding beginning state; and searching the sequence database for a sequence that results in a desired end state and starts from a current machine state.

7. The method of operating a lithographic processing machine according to claim 6, wherein said searching the sequence database comprises searching the sequence database for a sequence that results in a desired end state and starts from a state currently represented in the state register.

8. The method of operating a lithographic processing machine according to claim 6, wherein said searching the sequence database is performed prior to said constructing a plurality of different possible sequences of tasks.

9. The method of operating a lithographic processing machine according to claim 6, wherein said maintaining a sequence database comprises storing in said task database a representation of a sequences of tasks as a task cluster.

10. The method of operating a lithographic processing machine according to claim 1, said method comprising:
using patterning structure to impart a beam of radiation with a pattern in its cross-section; and
projecting the patterned beam of radiation onto a target portion of a substrate, wherein said performing the selected possible sequence includes performing an operation affecting the substrate.

11. A control system configured to operate a lithographic processing machine capable of performing a plurality of tasks and configured to have a plurality of states over time, each of the plurality of tasks being associated with a corresponding beginning state of the plurality of states, in which the machine is configured to initiate the task, and a corresponding end state of the plurality of states, in which the machine is configured to complete the task, the control system comprising:
a state register configured to represent a state of the machine at a corresponding time;
an update mechanism configured to update said state register according to a change in the state of the machine over time;
a task database configured to store information relating each of the plurality of tasks with its corresponding beginning and end states;
a sequence construction mechanism configured to construct, based on the task database, a plurality of possible sequences of tasks;
a search engine configured to select one among said plurality of possible sequences that starts from a given beginning state of the machine and results in a desired end state of the machine and configured to select at least one among the group consisting of (A) said constructing a plurality of possible sequences and (B) said selecting one among said plurality of possible sequences comprises detecting and rejecting sequences that loop; and
a controller configured to control said machine to perform the selected possible sequence.

12. A lithographic processing machine capable of performing a plurality of tasks and configured to have a plurality of states over time, each of the plurality of tasks being associated with a corresponding beginning state of the plurality of states, in which the machine is configured to initiate the task, and a corresponding end state of the plurality of states, in which the machine is configured to complete the task, said machine comprising a control system configured to operate the machine, the control system comprising:
a state register configured to represent a state of the machine at a corresponding time;
an update mechanism configured to update said state register according to a change in the state of the machine over time;
a task database configured to store information relating each of the plurality of tasks with its corresponding beginning and end states;
a sequence construction mechanism configured to construct, based on the task database, a plurality of possible sequences of tasks;
a search engine configured to select one among said plurality of possible sequences that starts from a given beginning state of the machine and results in a desired end state of the machine and configured to select at least one among the group consisting of (A) said constructing a plurality of possible sequences and (B) said selecting one among said plurality of possible sequences comprises detecting and rejecting sequences that loop; and
a controller configured to control said machine to perform the selected possible sequence.

13. The lithographic processing machine according to claim 12, said machine comprising:
a substrate table configured to hold a substrate; and
a projection system configured to project a patterned beam of radiation onto a target portion of the substrate.

14. The lithographic processing machine according to claim 13, said machine comprising a support structure for supporting patterning structure, the patterning structure serving to impart a beam of radiation with a pattern in its cross-section to obtain the patterned beam of radiation.

15. The lithographic processing machine according to claim 14, said machine comprising an illumination system configured to provide the beam of radiation.

16. The lithographic processing machine according to claim 12, said machine comprising a track unit including wafer handling devices and pre- and post-processing devices.

17. A lithographic processing cell comprising:
a plurality of lithographic processing machines, at least one of said lithographic processing machines being capable of performing a plurality of tasks and configured to have a plurality of states over time, each of the plurality of tasks being associated with a corresponding beginning state of the plurality of states, in which the machine is configured to initiate the task, and a corresponding end state of the plurality of states, in which the machine is configured to complete the task; and
a control system configured to operate said at least one of the plurality of lithographic processing machines, the control system comprising: a state register configured to represent a state of the machine at a corresponding time;
an update mechanism configured to update said state register according to a change in the state of the machine over time; a task database configured to store information relating each of the plurality of tasks with its corresponding beginning and end states;
a sequence construction mechanism configured to construct, based on the task database, a plurality of possible sequences of tasks;
a search engine configured to select one among said plurality of possible sequences that starts from a given beginning state of the machine and results in a desired end state of the machine and configured to select at least one among the group consisting of (A) said constructing a plurality of possible sequences and (B) said selecting one among said plurality of possible sequences comprises detecting and rejecting sequences that loop; and
a controller configured to control said machine to perform the selected possible sequence, wherein said plurality of lithographic processing machines includes a lithographic apparatus and a track unit.

18. A data storage medium having machine-executable instructions, said instructions describing a method of operating a lithographic processing machine capable of performing a plurality of tasks and configured to have a plurality of states over time, each of the plurality of tasks being associated with a corresponding beginning state of the plurality of states, in which the machine is configured to initiate the task, and a corresponding end state of the plurality of states, in which the machine is configured to complete the task, the method comprising:

maintaining a state register representing a state of the machine at a particular time;

providing a task database relating each of the plurality of tasks with its corresponding beginning and end states;

based on the task database, constructing a plurality of possible sequences of tasks;

selecting one among said plurality of possible sequences that starts from a given beginning state of the machine and results in a desired end state of the machine;

selecting at least one among the group consisting of (A) said constructing a plurality of possible sequences and (B) said selecting one among said plurality of possible sequences comprises detecting and rejecting sequences that loop; and controlling the machine to perform the selected possible sequence.

19. A method of operating a lithographic processing machine capable of performing a plurality of tasks and configured to have a plurality of states over time, each of the plurality of tasks being associated with a corresponding beginning state of the plurality of states, in which the machine is configured to initiate the task, and a corresponding end state of the plurality of states, in which the machine is configured to complete the task, the method comprising:

based on a task database that relates each of the plurality of tasks with its corresponding beginning and end states, constructing a plurality of possible sequences of tasks;

selecting one among said plurality of possible sequences that starts from a given beginning state of the machine and results in a desired end state of the machine; and selecting at least one among the group consisting of (A) said constructing a plurality of possible sequences and (B) said selecting one among said plurality of possible sequences comprises detecting and rejecting sequences that loop.

20. The method of operating a lithographic processing machine according to claim 19, said method comprising controlling the machine to perform the selected possible sequence.

* * * * *